United States Patent
Hosotani et al.

(10) Patent No.: US 6,653,703 B2
(45) Date of Patent: Nov. 25, 2003

(54) SEMICONDUCTOR MEMORY DEVICE USING MAGNETO RESISTIVE ELEMENT AND METHOD OF MANUFACTURING THE SAME

(75) Inventors: Keiji Hosotani, Tokyo (JP); Kentaro Nakajima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/125,374

(22) Filed: Apr. 19, 2002

(65) Prior Publication Data

US 2002/0153580 A1 Oct. 24, 2002

(30) Foreign Application Priority Data

Apr. 20, 2001 (JP) ........................................ 2001-122883

(51) Int. Cl.$^7$ ........................... H01L 43/00; G11C 11/00
(52) U.S. Cl. ...................... 257/421; 257/424; 257/427; 365/158; 365/171; 365/173
(58) Field of Search .................. 257/295, 421, 257/422, 424, 427; 438/3; 365/171, 173, 33, 158

(56) References Cited

U.S. PATENT DOCUMENTS

| | | | |
|---|---|---|---|
| 5,640,343 A | 6/1997 | Gallagher et al. | 365/171 |
| 5,946,227 A | * 8/1999 | Naji | 365/158 |
| 5,946,228 A | 8/1999 | Abraham et al. | 365/173 |
| 5,982,658 A | * 11/1999 | Berg et al. | 365/158 |
| 6,509,621 B2 | * 1/2003 | Nakao | 257/421 |

FOREIGN PATENT DOCUMENTS

| | | |
|---|---|---|
| EP | 0 936 624 | 8/1999 |
| EP | 1 085 586 | 3/2001 |
| JP | 2000-195250 | 7/2000 |

* cited by examiner

Primary Examiner—David Nelms
Assistant Examiner—Long Tran
(74) Attorney, Agent, or Firm—Oblon, Spivak, McClelland, Maier & Neustadt, P.C.

(57) ABSTRACT

A semiconductor memory device includes a first wiring extending in a first direction, a second wiring extending in a second direction differing from the first direction, and a magneto resistive element arranged between the first and second wirings and including a first portion and a second portion, the second portion being in contact with the second wiring and extending along the second wiring to reach an outside region positioned outside the first portion.

16 Claims, 21 Drawing Sheets

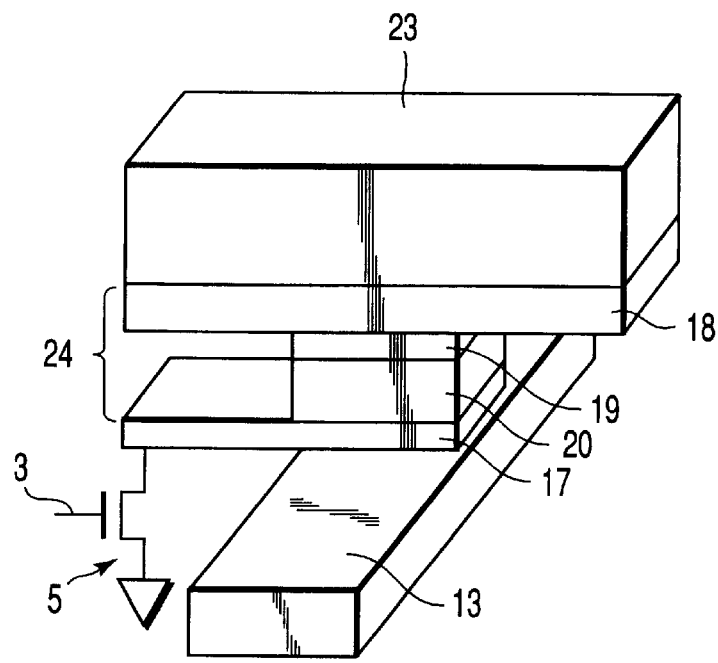
F I G. 18A
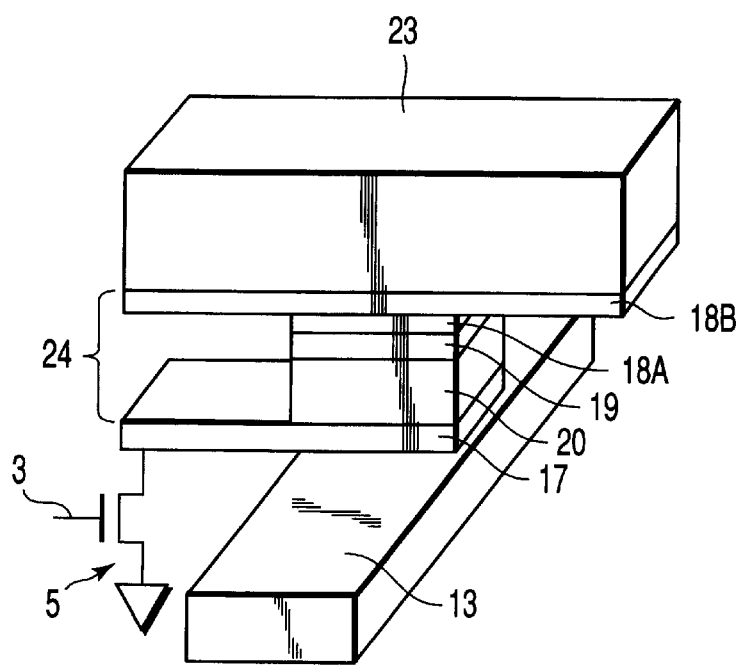
F I G. 18B

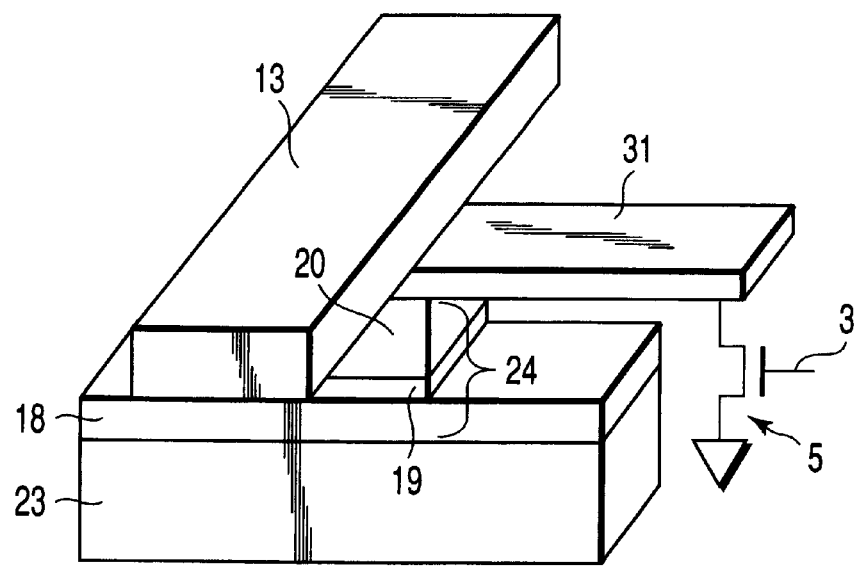
F I G. 24A
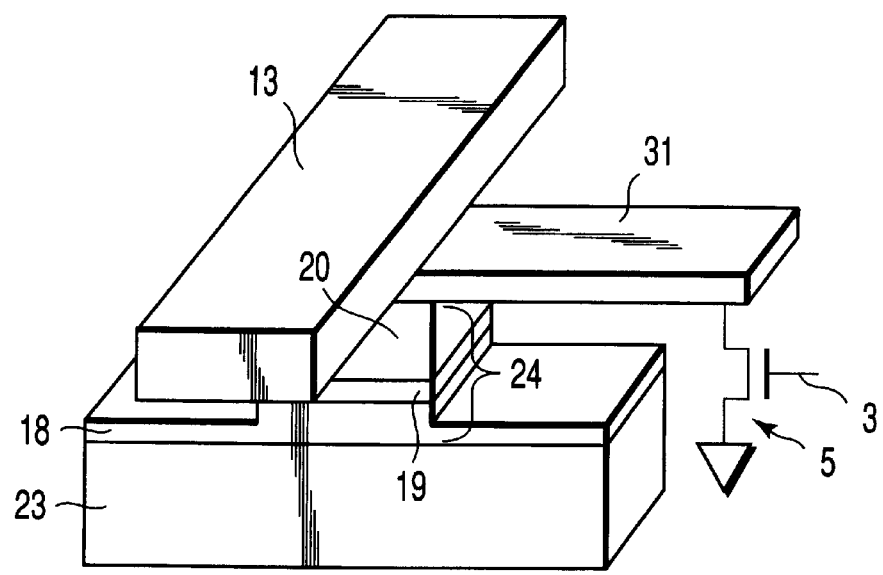
F I G. 24B

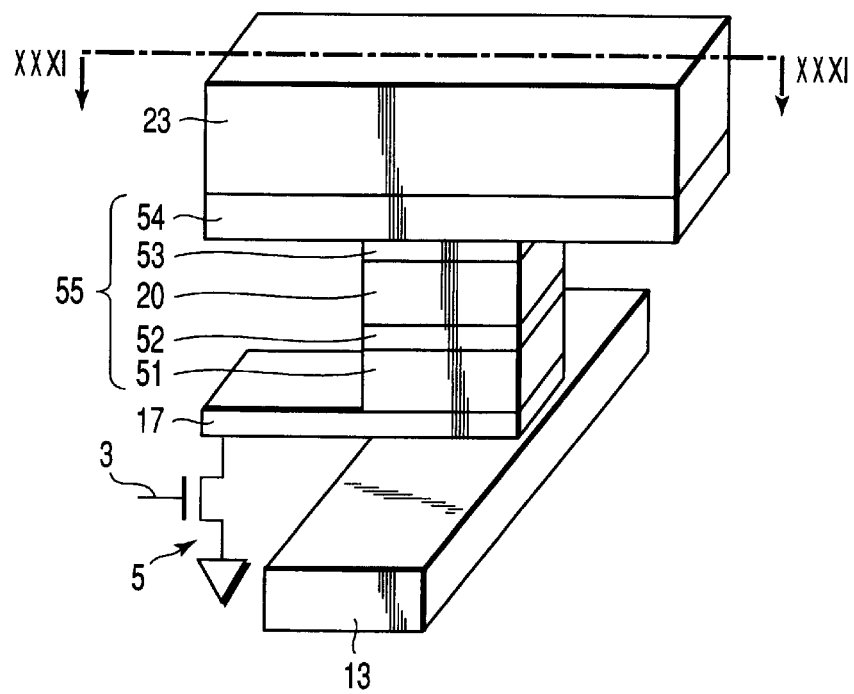
F I G. 25A
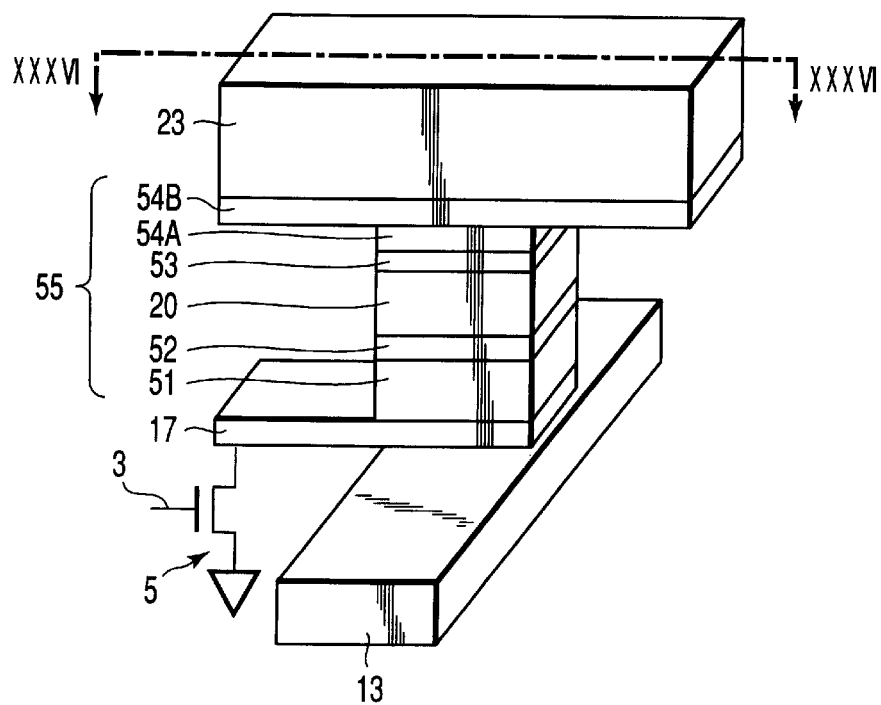
F I G. 25B

SEMICONDUCTOR MEMORY DEVICE USING MAGNETO RESISTIVE ELEMENT AND METHOD OF MANUFACTURING THE SAME

CROSS-REFERENCE TO RELATED APPLICATIONS

This application is based upon and claims the benefit of priority from the prior Japanese Patent Application No. 2001-122883, filed Apr. 20, 2001, the entire contents of which are incorporated herein by reference.

BACKGROUND OF THE INVENTION

1. Field of the Invention

The present invention relates to a semiconductor device and a method of manufacturing the same, particularly, to a magnetic memory apparatus (MRAM: Magnetic Random Access Memory) using a tunneling magneto resistive (TMR) element as a memory element and a method of manufacturing the same.

2. Description of the Related Art

In recent years, a magnetic random access memory (MRAM) utilizing the tunneling magneto resistive effect has been proposed as an information memory element.

FIG. 57 is an oblique view schematically showing a conventional semiconductor memory device. The construction of the MRAM will now be described briefly with reference to FIG. 57.

As shown in FIG. 57, a plurality of bit lines 23 and a plurality of write word lines 13 are arranged to cross each other at right angles so as to form a matrix configuration, and a TMR element 24 is arranged at each intersection between the bit line 23 and the write word line 13. The TMR element 24 is connected to the bit line 23 through an upper electrode (not shown) and is also connected to a switching element (MOSFET) 5 through a lower electrode 17. The gate electrode of the MOSFET acts as a read word line 3.

The TMR element 24 comprises a magnetically fixed layer 18 connected to the lower electrode 17, a magnetic recording layer 20 connected to the bit line 23 through upper electrode, and a tunnel barrier layer (tunnel junction film) 19 interposed between the magnetically fixed layer 18 and the magnetic recording layer 20.

The magnetically fixed layer 18 has a direction of magnetization fixed to an easy axis direction (EA direction). On the other hand, the magnetic recording layer 20 has two magnetization directions determined by the mutual function between the magnetic recording layer 20 and the magnetically fixed layer 18, said two magnetization directions corresponding to the information memory states of "1" and "0". The resistance of the tunnel junction is rendered lowest when the direction of magnetization of the magnetic recording layer 20 is made equal to the magnetization direction of the magnetically fixed layer 18, and is rendered highest when the direction of magnetization of the magnetic recording layer 20 is made opposite to that of the magnetically fixed layer 18. The particular change in the resistance is read by allowing an electric current to flow through the TMR element 24 so as to make it possible to judge the information memory states of "1" and "0".

The MRAM memory cell of the particular construction is designed such that the magnetization direction of only the magnetic recording layer 20 is reversed by the magnetic field synthesized by the current magnetic field generated from the current flowing through both the selected bit line 23 and the selected write word line 13, though the magnetization direction of the magnetically fixed layer 18 remains unchanged. Therefore, where data is written in an optional cell, the magnetization direction of the magnetic recording layer 20 is reversed as described above so as to write information in the selected cell. On the other hand, where data is read from an optional cell, the bit line 23 and the read word line 13 are selected and a current value flowing from the bit line 23 through the TMR element 24, the lower electrode 17, and the switching MOSFET 5 is compared with, for example, a reference cell so as to judge the information memory states of "1" and "0" denoting the resistance state of the cell.

FIG. 58 shows by arrows the state of magnetization of the magnetic recording layer included in the conventional semiconductor memory device. As shown in FIG. 58, domains 100 in which the magnetization vectors in the longitudinal direction are turned are actually formed in both edge portions of the magnetic recording layer 20, though it is ideal for all the magnetization directions 28 to be aligned in the easy axis direction (EA direction) in the magnetic recording layer 20. A so-called "diamagnetic field" is generated by the presence of these domains 100. As a result, in the region in which the diamagnetic field has been generated, it is impossible to maintain uniform the original tunnel resistance corresponding to the information memory states of "1" and "0". This gives rise to the problem that the S/N ratio of the signals of "1" and "0" that can be output is degraded, resulting in failure to ensure a sufficient operating margin and to read out data.

In order to overcome the above-noted problem, the length in the longitudinal direction of the cell is increased in the prior art so as to achieve a vertical-longitudinal ratio of, for example, at least 3, thereby ensuring an area required for the reading of data even if a diamagnetic field is generated in each of the both edges of the cell. However, the measure pointed out above leads to enlargement of the cell area so as to provide a large obstacle to the miniaturization of the MRAM cells in the future.

As described above, the prior art is defective in that the domains 100 generated in the cell degrade the operating margin in reading the data and make it difficult to miniaturize the cell.

BRIEF SUMMARY OF THE INVENTION

According to a first aspect of the present invention, there is provided a semiconductor memory device, comprising a first wiring extending in a first direction, a second wiring extending in a second direction differing from the first direction, and a magneto resistive element arranged between the first wiring and the second wiring and comprising a first portion and a second portion, the second portion being in contact with the second wiring and extending along the second wiring to reach an outside region positioned outside the first portion.

According to a second aspect of the present invention, there is provided a method of manufacturing a semiconductor memory device provided with a magneto resistive element including a first portion and a second portion, comprising extending the second portion along a second wiring to reach an outside region positioned outside the first portion by patterning the second portion together with the second wiring.

BRIEF DESCRIPTION OF THE SEVERAL VIEWS OF THE DRAWING

FIGS. 18A and 18B are oblique views collectively showing schematically the construction of a semiconductor memory device according to a second embodiment of the present invention;

FIGS. 24A and 24B are oblique views collectively showing schematically the construction of a semiconductor memory device according to a fourth embodiment of the present invention;

FIGS. 25A and 25B are oblique views collectively showing schematically the construction of a semiconductor memory device according to a fifth embodiment of the present invention;

DETAILED DESCRIPTION OF THE INVENTION

Figure 1A:
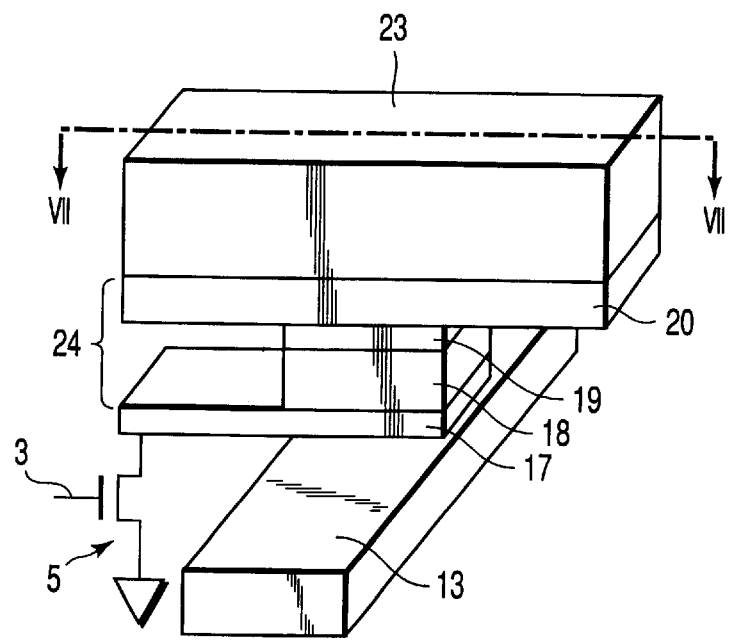
FIGS. 1A and 1B are oblique views collectively showing schematically the construction of a semiconductor memory device according to a first embodiment of the present invention.

Each embodiment of the present invention is directed to a magnetic random access memory (MRAM) using a tunneling magneto resistive (TMR) element as a memory element. In the MRAM of the present invention, a plurality of memory cells each equipped with a TMR element, which are arranged to form a matrix, constitute a memory cell array structure, and a peripheral circuit portion such as decoders or sense amplifiers is arranged in the peripheral portion of these memory cells. The write and read operations of information can be performed by the random access to an optional cell.

Some embodiments of the present invention will now be described with reference to the accompanying drawings. Throughout the drawings, the common portions are denoted by the common reference numerals. In the drawings covering the first to sixth embodiments of the present invention, the MOSFET shown in the seventh embodiment and the contact connected to the MOSFET are omitted.

[First Embodiment]

In the first embodiment, the magnetic recording layer constituting a TMR element extends along the bit line without being divided for each cell.

Figure 1B:
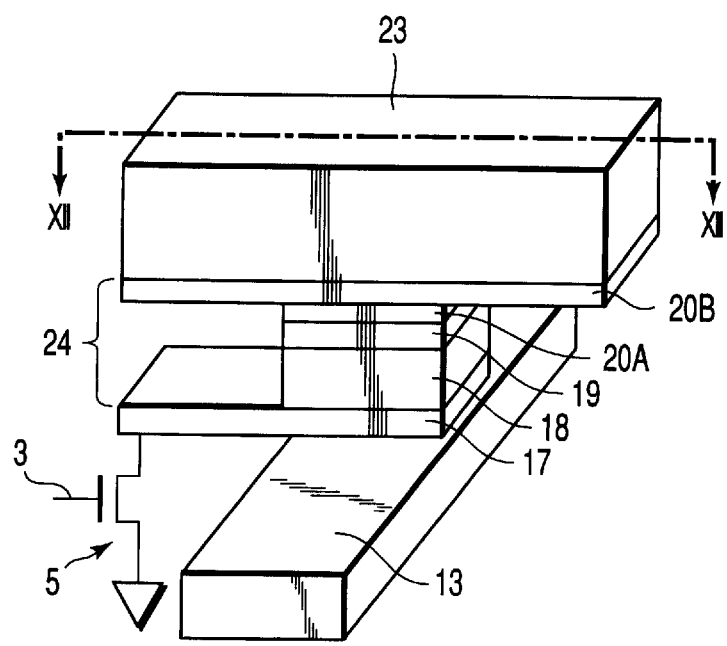

FIGS. 1A and 1B are oblique views collectively showing schematically the construction of a semiconductor memory device according to the first embodiment of the present invention.

As shown in FIG. 1A, the semiconductor memory device according to the first embodiment of the present invention is an MRAM comprising as a memory element a TMR element 24 including a magnetically fixed layer 18, a magnetic recording layer 20 and a tunnel barrier layer (tunnel junction film) 19 interposed between the magnetically fixed layer 18 and the magnetic recording layer 20. A switching transistor (e.g., MOSFET) 5 having a gate electrode (read word line) 3 is connected to the magnetically fixed layer 18 with a lower electrode 17 interposed therebetween. Also, a write word line 13 is arranged below and apart from the TMR element 24, and a bit line 23 connected to the magnetic recording layer 20 is arranged in a manner to cross the word line 13 at right angles.

Among the elements constituting the TMR element 24, the magnetically fixed layer 18 and the tunnel barrier wall layer 19 are formed independent of the bit line 23. However, the magnetic recording layer 20 is formed integral with the bit line 23. In other words, the magnetic recording layer 20 is formed to extend in the direction of the bit line 23 without being divided for each cell so as to cover at least two cells along the bit line 23. It follows that the magnetic recording layer 20 and the bit line 23 have the same shape.

It should be noted that it is possible to separate the magnetic recording layer 20 into a first pattern portion 20A and a second pattern portion 20B, as shown in FIG. 1B. In this case, the first pattern portion 20A of the magnetic recording layer is formed in the pattern of the TMR element 24, and the second pattern portion 20B of the magnetic recording layer is formed to extend in the direction of the bit line 23 without being divided for each cell so as to cover at least two cells along the bit line 23.

Figure 2A:
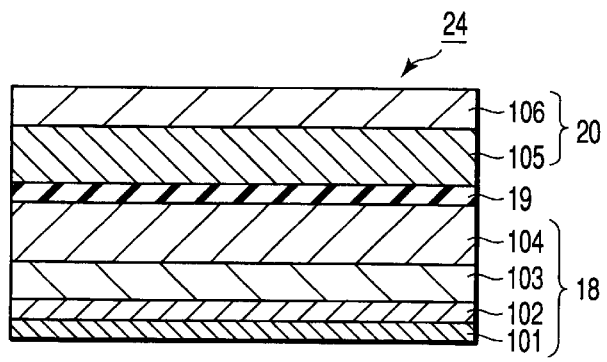
FIGS. 2A and 2B are cross sectional views collectively showing a TMR element having a single tunnel barrier wall layer according to the first embodiment of the present invention.
Figure 2B:
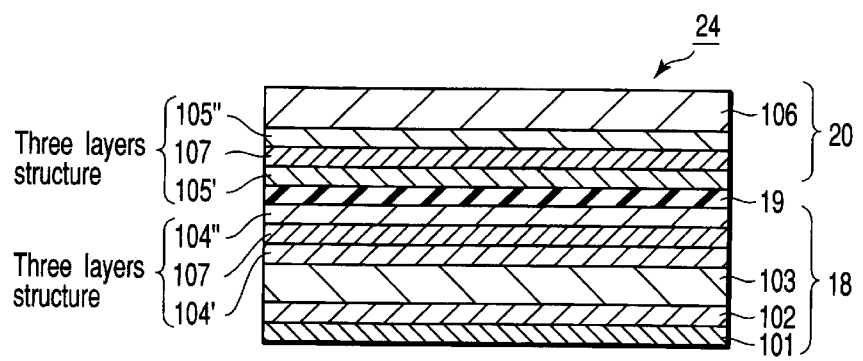

FIGS. 2A and 2B are cross sectional views collectively showing the TMR element 24 having a single tunnel barrier wall structure. It is desirable for the TMR element 24 to be a structure having a single tunnel barrier wall layer shown in FIG. 2A or FIG. 2B. The construction of the TMR element 24 having a single tunnel barrier wall layer will now be described.

The TMR element 24 shown in FIG. 2A comprises a magnetically fixed layer 18 including a template layer 101, an initial ferromagnetic layer 102, an antiferromagnetic layer 103, and a reference ferromagnetic layer 104, which are laminated one upon the other in the order mentioned, a tunnel barrier wall layer 19 formed on the magnetically fixed layer 18, and a magnetic recording layer 20 formed on the tunnel barrier wall layer 19 and including a free ferromagnetic layer 105 and a contact layer 106 formed on the free ferromagnetic layer 105.

Likewise, the TMR element 24 shown in FIG. 2B comprises a magnetically fixed layer 18 including a template layer 101, an initial ferromagnetic layer 102, an antiferromagnetic layer 103, a ferromagnetic layer 104', a nonmagnetic layer 107 and a ferromagnetic layer 104", which are laminated one upon the other in the order mentioned, a tunnel barrier wall layer 19 formed on the magnetically fixed layer 18, and a magnetic recording layer 20 formed on the tunnel barrier wall layer 19 and including a free ferromagnetic layer 105', a nonmagnetic layer 107, a ferromagnetic layer 105" and a contact layer 106, which are laminated one upon the other in the order mentioned.

It should be noted that a three layer structure including the ferromagnetic layer 104', the nonmagnetic layer 107 and the ferromagnetic layer 104", which are formed within the magnetically fixed layer 18, and another three layer structure including the ferromagnetic layer 105', the nonmagnetic layer 107 and the ferromagnetic layer 105", which are formed within the magnetic recording layer 20, are introduced into the TMR element 24 shown in FIG. 2B. This particular construction makes it possible to suppress the generation of the magnetic pole within the ferromagnetic layer so as to provide a cell structure more adapted for the miniaturization, compared with the TMR element 24 shown in FIG. 2A.

The TMR element 24 having the particular single tunnel barrier wall layer is formed of the materials described in the following.

It is desirable for the magnetically fixed layer 18 and the magnetic recording layer 20 to be formed of, for example, Fe, Co, Ni or an alloy thereof, a magnetite having a large spin polarizability, oxides such as $CrO_2$, $RXMnO_{3-y}$ (R: rare earth elements; X: Ca, Ba, Sr), and Heusler alloys such as NiMnSb and PtMnSb. It is possible for these magnetic bodies to contain a small amount of Ag, Cu, Au, Al, Mg, Si, Bi, Ta, B, C, 0, N, Pd, Pt, Zr, Ir, W, Mo and Nb as far as the ferromagnetic properties are not lost.

It is desirable for the antiferromagnetic layer 103 constituting a part of the magnetically fixed layer 18 to be formed of, for example, Fe—Mn, Pt—Mn, Pt—CrMn, Ni—Mn, Ir—Mn, NiO, and $Fe_2O_3$.

It is possible for the tunnel barrier wall layer to be formed of various dielectric bodies such as $Al_2O_3$, $SiO_2$, MgO, AlN, $Bi_2O_3$, $MgF_2$, $CaF_2$, $SrTiO_2$, and $AlLaO_3$. It is possible for an oxygen loss, a nitrogen loss or a fluorine loss to be present in these dielectric bodies.

It is possible to apply the structure of the TRM element 24 having a single tunnel barrier wall layer shown in FIG. 2A or FIG. 2B to other embodiments of the present invention which are to be described herein later.

FIGS. 3 to 7 are cross sectional views along the line VII—VII shown in FIG. 1A collectively showing a first method of manufacturing a semiconductor memory device according to the first embodiment of the present invention. The first method of manufacturing a semiconductor memory device according to the first embodiment of the present invention will now be described with reference to FIGS. 3 to 7.

Figure 3:
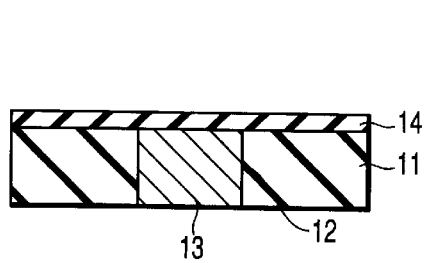
FIGS. 3, 4, 5, 6 and 7 are cross sectional views collectively showing a first method of manufacturing a semiconductor device according to the first embodiment of the present invention.

In the first step, a first interlayer insulating film 11 is formed on the surface of a semiconductor substrate having a MOSFET (not shown) formed therein, followed by selectively forming a write word line 13 within the first interlayer insulating film 11, as shown in FIG. 3, followed by depositing a second interlayer insulating film 14 on the write word line 13 and within a gap portion (not shown). It should be noted that the second interlayer insulating film 14 formed on the write word line 13 serves to determine the distance between the write word line 13 and the TMR element 24 and acts as an underlying film in the step of forming the TMR element 24. Therefore, in order to form the second interlayer insulating film 14 thin and uniform on the write word line 13, it is necessary for the write word line 13 to be formed to have a flat surface. Therefore, it is desirable to form the write word line 13 by using, for example, a damascene method. To be more specific, after formation of a groove 12 for the write word line in the first interlayer insulating film 11, a metal material forming the write word line 13 is deposited within the groove 12 and on the first interlayer insulating film 11 by a sputtering method. Then, the deposited metal material layer is flatted by a CMP (chemical mechanical polish) method until the surface of the first interlayer insulating film is exposed to the outside so as to form the write word line 13. Further, the second interlayer insulating film 14 is deposited thinly on the write word line 13 and the first interlayer insulating film 11 by a CVD (chemical vapor deposition) method.

Figure 4:
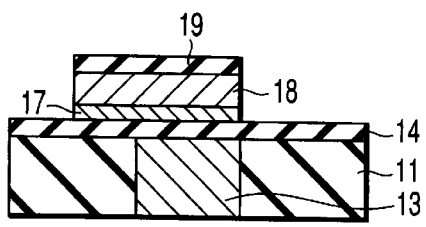

In the next step, a lower electrode 17, a magnetically fixed layer 18 and a tunnel barrier layer 19 are formed successively on the second interlayer insulating film 14, as shown in FIG. 4. Incidentally, the magnetically fixed layer 18 is of a laminate structure including a plurality of films that are laminated one upon the other as shown in FIGS. 2A and 2B, though the magnetically fixed layer 18 is depicted as a single layer in FIG. 4. Then, a resist film (not shown) is formed on the tunnel barrier wall layer 19, followed by patterning the resist film by photolithography technology to conform with the pattern of the lower electrode 17 shown in FIG. 1A. Alternatively, a hard mask such as DLC (diamond like carbon) and a resist film (not shown) are formed on the tunnel barrier wall layer 19, followed by patterning the resist film by the photolithography technology to conform with the pattern of the lower electrode 17 shown in FIG. 1A and subsequently patterning the DLC film by using the patterned resist film. Further, the tunnel barrier wall layer 19, the magnetically fixed layer 18 and the lower electrode 17 are collectively patterned by a RIE (reactive ion etching) method or an ion milling method with the patterned resist film or the patterned DLC film used as a mask.

Figure 5:
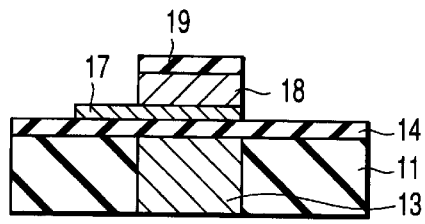

Then, the tunnel barrier wall layer 19 and the magnetically fixed layer 18 are collectively patterned by the RIE method or the ion milling method, with the resist film (not shown) or the DLC film (not shown), which are patterned to conform with the pattern of the TMR element 24 shown in FIG. 1A, used as the mask, as shown in FIG. 5.

It should be noted that in the process shown in FIG. 4, the tunnel barrier wall layer 19, the magnetically fixed layer 18 and the lower electrode 17 are patterned, with the result that a stepping is formed between the surface of the tunnel barrier wall layer 19 and the second interlayer insulating film 14. In other words, since a large stepping is formed in the underlying layer in performing the process shown in FIG. 5, it is possible to pattern the tunnel barrier wall layer 19 and the magnetically fixed layer 18 in several steps. To be more specific, it is possible to coat in advance the tunnel barrier wall layer 19 and the second interlayer insulating film 14 with, for example, an SOG (spin on glass) film so as to flat the entire surface, followed by collectively patterning the tunnel barrier wall layer 19 and the magnetically fixed layer 18.

Figure 6:
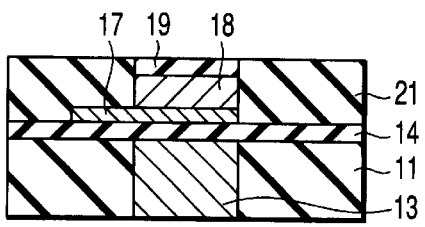

In the next step, a third interlayer insulating film 21 is deposited on the tunnel barrier wall layer 19, the lower electrode 17 and the second interlayer insulating film 14, with the mask used in the step of patterning the tunnel barrier wall layer 19 and the magnetically fixed layer 18 left unremoved, such that the gaps above the removed portions of the magnetically fixed layer 18 and the tunnel barrier wall layer 19 are filled with the third interlayer insulating film 21, as shown in FIG. 6. Then, the third interlayer insulating film 21 is flatted by a CMP method with the mask noted above used as a stopper, followed by removing the mask.

Figure 7:
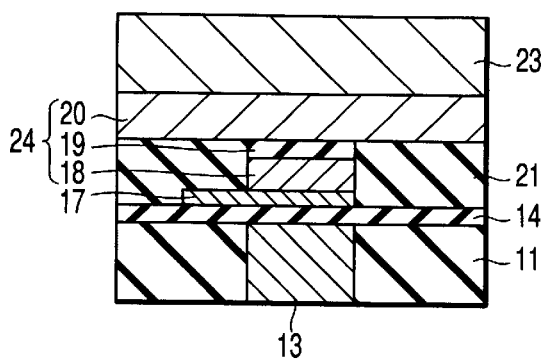

Finally, a magnetic recording layer 20 and a metal material layer for forming a bit line 23 are deposited on the tunnel barrier wall layer 19 and the third interlayer insulating film 21 by, for example, a sputtering method, as shown in FIG. 7. Then, the magnetic recording layer 20 and the metal material layer for forming the bit line 23 are collectively patterned by the photolithography technology using a resist patterned to conform with the pattern of the bit line 23 shown in FIG. 1A. As a result, the magnetic recording layer 20 and the bit line 23 are formed, thereby finishing formation of the TMR element 24.

FIGS. 8 to 12 are cross sectional views along the line XII—XII shown in FIG. 1B collectively showing a second method of manufacturing a semiconductor memory device according to the first embodiment of the present invention. In the second manufacturing method, only a part of the magnetic recording layer 20 is allowed to extend along the bit line 23. The second method of manufacturing the semiconductor memory device according to the first embodiment of the present invention will now be described with reference to FIGS. 8 to 12.

Figure 8:
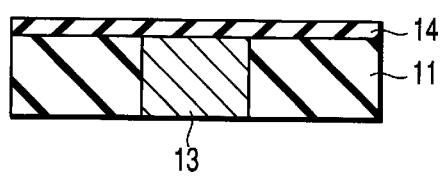

In the first step, the write word line 13 is formed selectively within the first interlayer insulating film 11 by the method similar to that employed in the first manufacturing method, followed by depositing the second interlayer insulating film 14 on the write word line 13 and within a gap portion (not shown), as shown in FIG. 8.

Figure 9:
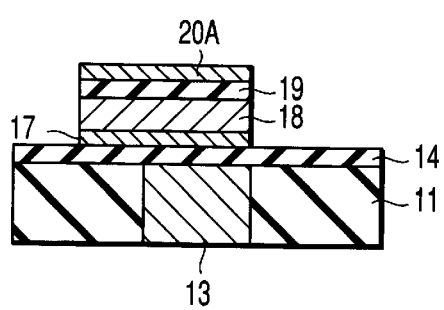

In the next step, the lower electrode 17, the magnetically fixed layer 18, the tunnel barrier wall layer 19 and a first pattern portion 20A of the magnetic recording layer are successively formed on the second interlayer insulating film 14, as shown in FIG. 9. It should be noted that the first pattern portion 20A of the magnetic recording layer constitutes a part of the magnetic recording layer 20. Then, the first pattern portion 20A of the magnetic recording layer, the tunnel barrier wall layer 19, the magnetically fixed layer 18 and the lower electrode 17 are collectively patterned by a RIE method or an ion milling method, with a resist film (not shown) or a DLC film (not shown), which is patterned to conform with the pattern of the lower electrode 17 shown in FIG. 1B, used as a mask.

Figure 10:
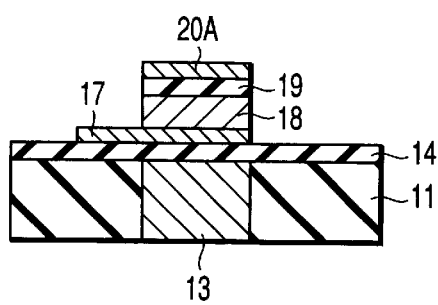
FIGS. 8, 9, 10, 11 and 12 are cross sectional views collectively showing a second method of manufacturing a semiconductor device according to the first embodiment of the present invention.

Then, the first pattern portion 20A of the magnetic recording layer, the tunnel barrier wall layer 19 and the magnetically fixed layer 18 are collectively patterned by the method similar to that employed in the first manufacturing method described previously, by employing a RIE method or an ion milling method, with a resist film (not shown) or a DLC film (not shown), which is patterned to conform with the pattern of the TMR element 24 shown in FIG. 1B, used as a mask, as shown in FIG. 10.

Figure 11:
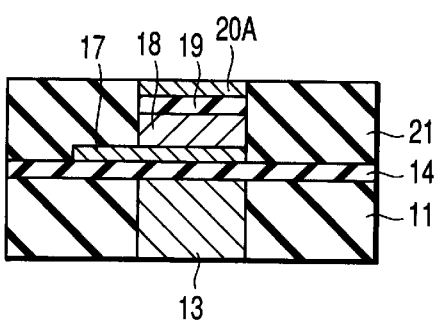

In the next step, a third interlayer insulating film 21 is deposited on the first pattern portion 20A of the magnetic recording layer, the lower electrode 17 21 and the second interlayer insulating film 14 by the method similar to that employed in the first manufacturing method described previously, followed by flatting the surface of the third interlayer insulating film 21, as shown in FIG. 11.

Figure 12:
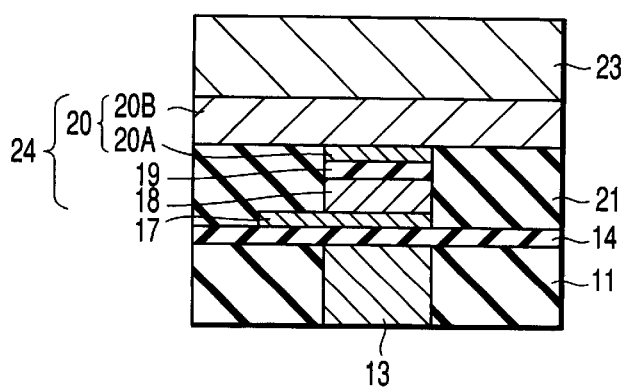

Further, a second pattern portion 20B of the magnetic recording layer constituting the remaining part of the magnetic recording layer 20 and a bit line 23 are deposited by the method similar to that employed in the first manufacturing method, as shown in FIG. 12. Then, the second pattern portion 20B of the magnetic recording layer and the bit line 23 are collectively patterned so as to form the TMR element 24.

It should be noted that a part of the magnetic recording layer 20, i.e., the first pattern portion 20A of the magnetic recording layer, is already patterned together with the TMR element 24 in the process shown in FIG. 12. Therefore, it is necessary in some cases to adjust the thickness of the second pattern portion 20B of the magnetic recording layer that is patterned together with the bit line 23.

FIGS. 13 to 16 are cross sectional views collectively showing a third manufacturing method of a semiconductor memory device according to the first embodiment of the present invention. In the third manufacturing method, the TMR element 24 is buried, and not only the magnetic recording layer 20 but also the tunnel barrier wall layer 19 are formed to extend along the bit line 23. The third manufacturing method of the semiconductor memory device according to the first embodiment of the present invention will now be described with reference to FIGS. 13 to 16.

Figure 13:
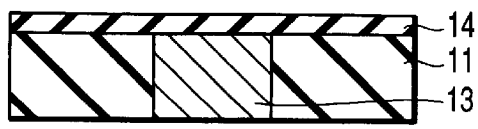
FIGS. 13, 14, 15 and 16 are cross sectional views collectively showing a third method of manufacturing a semiconductor device according to the first embodiment of the present invention.

In the first step, a write word line 13 is selectively formed in a first interlayer insulating film 11, followed by depositing a second interlayer insulating film 14 to cover the surfaces of the write word line 13 and a gap portion (not shown), as shown in FIG. 13.

Figure 14:
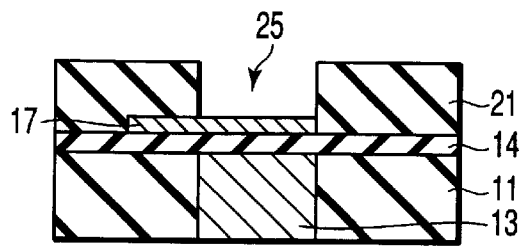

In the next step, a thin stopper insulating film (not shown), i.e., a silicon nitride film, is formed on the second interlayer insulating film 14, followed by forming a lower electrode layer on the stopper insulating film and subsequently patterning the lower electrode layer so as to form a lower electrode 17, as shown in FIG. 14. Then, a third interlayer insulating film 21 is formed to cover the lower electrode 17 and the second interlayer insulating film 14, followed by forming a groove 25 for forming a magnetically fixed layer in the third interlayer insulating film 21 so as to expose partly the lower electrode 17.

Figure 15:
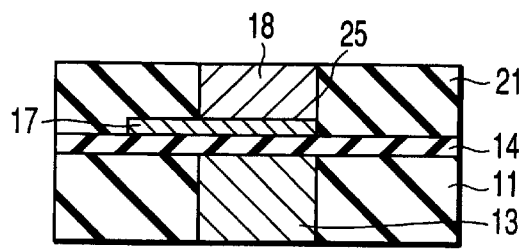

After formation of the groove 25, a material of the magnetically fixed layer is formed within the groove 25 and on the third interlayer insulating film 21, as shown in FIG. 15. Then, the layer of the material for forming the magnetically fixed layer is flatted by a CMP method until the surface of the third interlayer insulating film 21 is exposed to the surface, with the result that a magnetically fixed layer 18 is formed to fill the groove 25 of the third interlayer insulating film 21.

Figure 16:
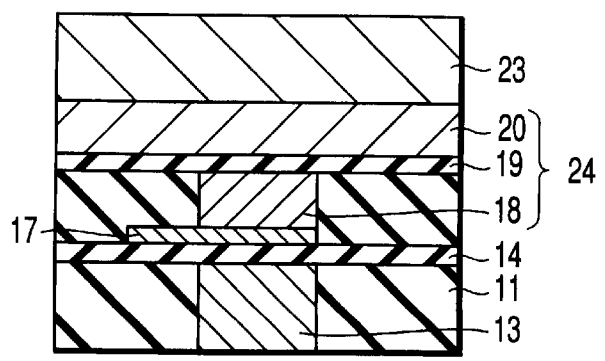

In the next step, a tunnel barrier wall layer 19, a magnetic recording layer 20 and a bit 23 are formed consecutively on the magnetically fixed layer 18 and the third interlayer insulating film 21, as shown in FIG. 16. Then, the tunnel barrier wall layer 19, the magnetic recording layer 20 and the bit line 23 are collectively pattern by a RIE method or an ion milling method, with a resist film (not shown) or a DLC film (not shown), which is patterned to conform with the pattern of the bit line 23 shown in FIG. 1A, used as a mask.

According to the first embodiment described above, the magnetic recording layer 20 constituting the TMR element 24 is not separated for every cell and is allowed to extend along the bit line 23. The particular construction produces prominent effects as described below.

It should be noted that the magnetically fixed layer 18 has a fixed direction of magnetization such that all the cells are magnetized in the same direction. On the other hand, information is written at random in the magnetic recording layer 20 and, thus, the magnetic recording layer 20 includes a region magnetized in the direction equal to the magnetization direction of the magnetically fixed layer 18 and another region that is magnetized in the opposite direction. Where the adjacent cells have the same information, the magnetization direction within the magnetic recording layer 20 is rendered consecutive, with the result that it is possible to carry out the write and read of the information with a high stability. On the other hand, the adjacent cells have opposite information, the adjacent cells of the magnetic recording layer 20 are rendered opposite to each in the direction of the magnetization.

Figure 17:
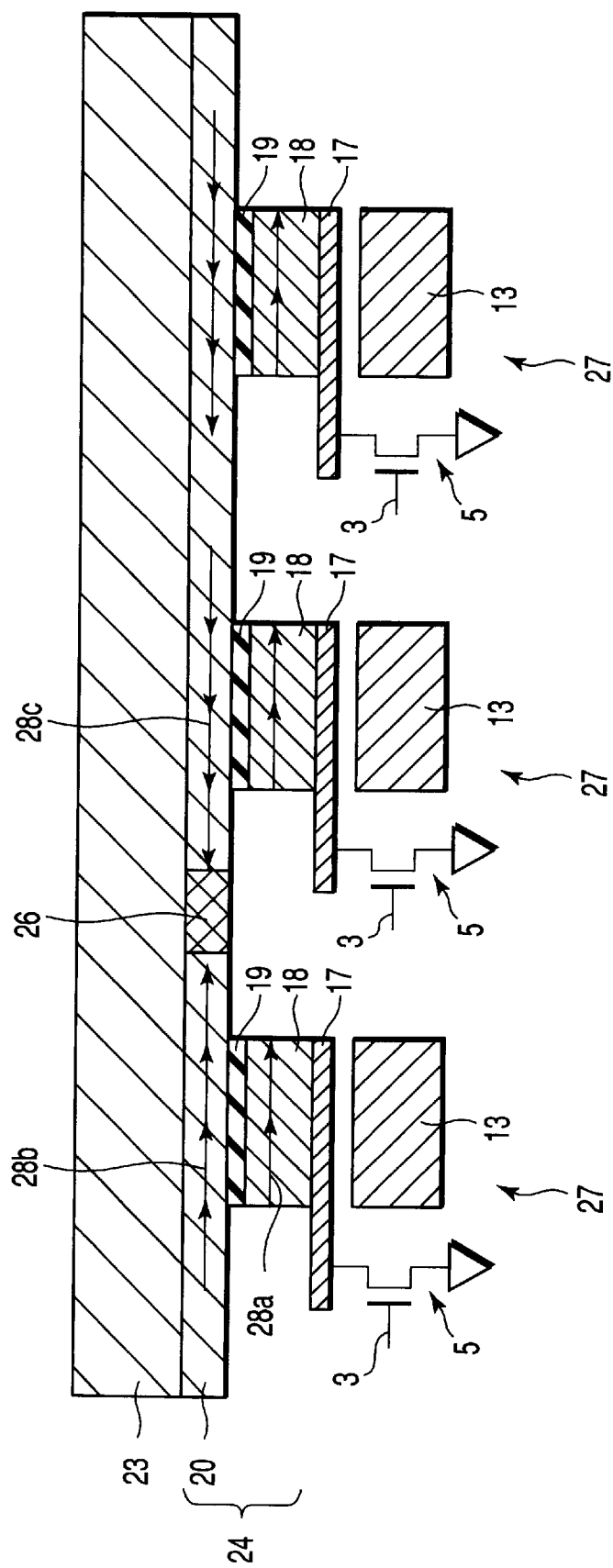
FIG. 17 is a cross sectional view of a semiconductor memory device showing the effect produced by the first embodiment of the present invention.

To be more specific, where opposite magnetization directions 28b and 28c are present in the magnetic recording layer 20 as shown in FIG. 17, the magnetic vectors collide against each other between the cells so as to generate a domain region (boundary layer) 26, which causes the generation of a diamagnetic field. In other words, according to the first embodiment of the present invention, the magnetic recording layer 20 is allowed to extend along the bit line 23 so as to permit the region of magnetization to reach the region between the adjacent cells 27. It follows that, in the first embodiment of the present invention, it is possible to permit the boundary layer 26, which causes the generation of a diamagnetic field, to be positioned between the adjacent cells 27, though the domain region causing the generation of a diamagnetic field was formed within the cell in the prior art. What should be noted that, since the boundary region 26 can be positioned outside the TMR element 24 in the first embodiment of the present invention, the read information is not deteriorated when the signal is read out. It follows that the first embodiment of the present invention makes it possible to provide the TMR element 24 free from the signal deterioration when the signal is read out even if a domain causing the generation of a diamagnetic field is generated.

What should also be noted is that, according to the first embodiment of the present invention, it is possible to suppress the deterioration of the margin for the read operation as described above so as to make it unnecessary to enlarge the cell as in the prior art. It follows that it is possible to miniaturize the cell.

It should also be noted that, since the magnetic recording layer 20 extends along the bit line 23 in the first embodiment of the present invention, it is possible to avoid the problem that the domain generated in the cell edge portion produces a detrimental effect. In addition, it is possible to avoid the problem of skew that the domain generated outside the cell edge portion produces a detrimental effect. Also, it is possible to impart a stable uniaxial anisotropy to the magnetic recording layer 20 and to alleviate the interlayer magnetostatic coupling (offset of hysteresis).

To be more specific, since it is possible to avoid the problems of the edge domain and the skew, it is possible to prevent the deterioration of the reading of the signal so as to improve the MR (magneto resistive) ratio, i.e., the rate of change between the state of "1" and the state of "0". It follows that it is possible to suppress the nonuniformity of the resistance in various portions of the memory cell, which is advantageous for the miniaturization of the cell.

Also, if the MR ratio is improved, the intensity of the read signal is increased so as to improve the sensing speed. As a result, the speed of the reading operation can be increased.

Also, since it is possible to alleviate the influence produced by the edge domain, the distance between the adjacent cells can be decreased so as to make it possible to diminish the effective cell area.

What should also be noted is that, since the interlayer magnetostatic coupling can be alleviated, it is possible to lower the nonuniformity in the threshold value of the write magnetic field to the magnetic recording layer 20. In addition, since the magnetic recording layer 20 is allowed to extend along the bit line 23, the detrimental effect produced by the change in the shape of the TMR element 24 need not be worried about. It follows that it is possible to lower the effective write current so as to lower the power consumption. It should be noted that if the TMR element 24 is miniaturized, the threshold value of the write magnetic field is increased. It follows that it is highly advantageous for miniaturizing the cell to suppress the nonuniformity of the threshold value so as to decrease the write current as much as possible.

The second manufacturing method, which produces the effects described above, also produces additional effects as follows. To be more specific, in the first manufacturing method, when the patterned magnetically fixed layer 18 and the tunnel barrier wall layer 19 having the third interlayer insulating film 21 buried therein are flatted (process shown in FIG. 6), the tunnel barrier wall layer 19 constitutes the uppermost layer, with the result that a damage is done to the tunnel barrier wall layer 19. In the second manufacturing method of the present invention, however, the first pattern portion 20A of the magnetic recording layer is formed on the tunnel barrier wall layer 19, with the result that, when the third interlayer insulating film 21 is flatted (process shown in FIG. 11), the tunnel barrier wall layer 19 can be protected by the first pattern portion 20A of the magnetic recording layer. It follows that the second manufacturing method of the present invention produces the effect that it is possible to prevent a damage from being done to the tunnel barrier wall layer 19 that must be formed in a thickness not larger than 100 Å so as to improve the reliability of the element without deteriorating the quality of the tunnel barrier wall layer 19.

Also, in the third manufacturing method, which permits producing the effects described above, the magnetic recording layer 20 is buried in the groove 25. As a result, it is unnecessary to employ the RIE method or the ion milling method so as to make the processing easy and facilitate the size control. The third manufacturing method produces an additional effect that, since the tunnel barrier wall layer is formed on the entire surface in the subsequent step, it is possible to prevent damage from being done to a region right above the TMR element 24.

[Second Embodiment]

The second embodiment differs from the first embodiment simply in that the positions of the magnetically fixed layer 18 and the magnetic recording layer 20 are reversed.

FIGS. 18A and 18B are oblique views showing the semiconductor memory device according to the second embodiment of the present invention.

As shown in FIG. 18A, the semiconductor memory device according to the second embodiment of the present invention is directed to an MRAM using as a memory element a TMR element 24 comprising a magnetically fixed layer 18, a magnetic recording layer 20 and a tunnel barrier 19 interposed between the magnetically fixed layer 18 and the magnetic recording layer 20. A switching transistor, e.g., MOSFET) 5 having a gate electrode (read word line) 3 is connected to the magnetic recording layer 20 through a lower electrode 17. Also, a word line 13 is arranged apart from the TMR element 24 below the TMR element 24, and a bit line 23 connected to the magnetically fixed layer 18 is arranged to cross the word line 13 at right angles.

Among the members forming the TMR element 24, the magnetic recording layer 20 and the tunnel barrier wall layer 19 are formed independent of the bit line 23. However, the magnetically fixed layer 18 is formed integral with the bit line 23. In other words, the magnetically fixed layer 18 extends in the direction of the bit line 23 without being separated for each cell and extends along the bit line 23. It follows that the magnetically fixed layer 18 and the bit line 23 have the same shape.

It should be noted that it is possible to separate the magnetically fixed layer 18 into a first pattern portion 18A and a second pattern portion 18B, as shown in FIG. 18B. In this case, the first pattern portion 18A of the magnetically fixed layer is included in the pattern of the TMR element 24, and the second pattern portion 18B of the magnetically fixed layer is formed to extend in the direction of the bit line 23 without being separated for each cell and extends along the bit line 23 to cover at least two adjacent cells.

The first to third manufacturing methods of the semiconductor memory device according to the first embodiment of the present invention can be employed for the manufacture of the semiconductor memory device according to the second embodiment of the present invention by interchanging the magnetically fixed layer 18 and the magnetic recording layer 20 in the first to third manufacturing methods of the semiconductor memory device according to the first embodiment of the present invention. Therefore, the manufacturing method of the semiconductor memory device according to the second embodiment of the present invention is omitted.

The second embodiment of the present invention permits producing the effects similar to those produced by the first embodiment of the present invention. Further, in the second embodiment of the present invention, the magnetically fixed layer 18 having the direction of magnetization fixed in one direction is allowed to extend along the bit line 23. Therefore, the magnetic vector of the magnetically fixed layer 18 is unlikely to incur the influence of the processing for miniaturizing the semiconductor memory device so as to make it possible to form the magnetically fixed layer 18 with a high stability.

It should also be noted that, since the magnetically fixed layer 18 is allowed to extend along the bit line 23, it is possible to suppress the demagnetization of the fixing layer. It follows that it is possible to obtain a magnetic tunnel junction film which is unlikely to be deteriorated and which is excellent in reliability even if the write operations are repeated.

[Third Embodiment]

In the third embodiment, a bit line 23 and a magnetic recording layer 20 are formed together before formation of a write word line 13 and a magnetically fixed layer 18.

Figure 19A:
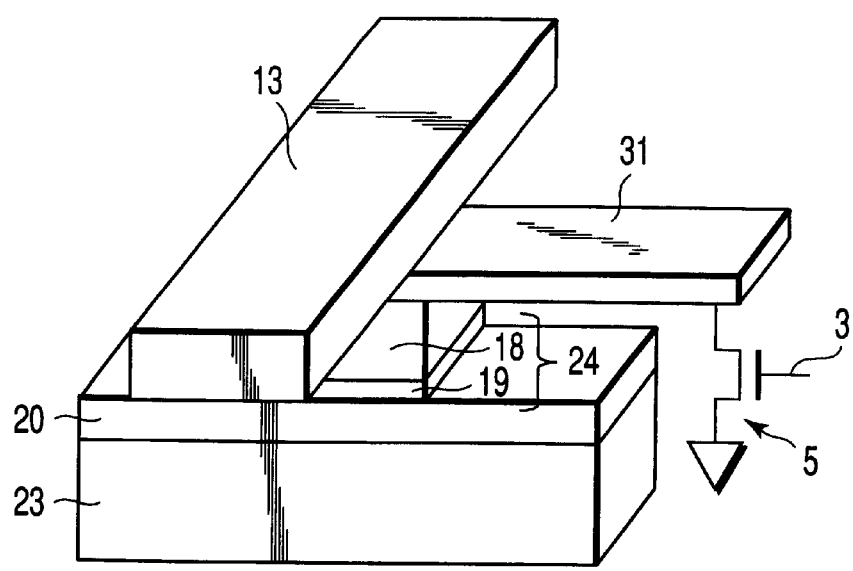
FIGS. 19A and 19B are oblique views collectively showing schematically the construction of a semiconductor memory device according to a third embodiment of the present invention.
Figure 19B:
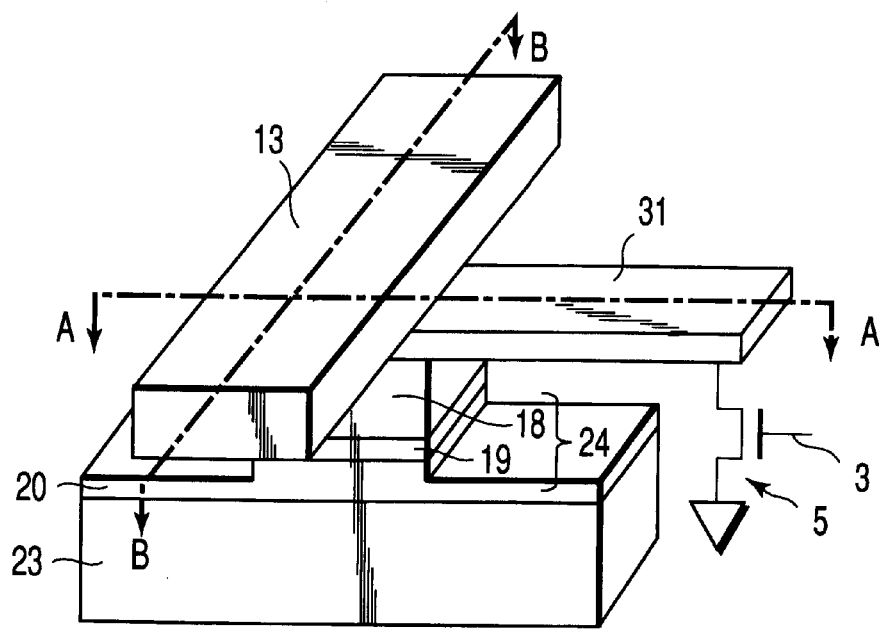

FIGS. 19A and 19B are oblique views schematically showing the construction of a semiconductor memory device according to the third embodiment of the present invention.

As shown in FIG. 19A, the semiconductor memory device according to the third embodiment of the present invention is directed to an MRAM using as a memory element a TMR element 24 comprising a magnetically fixed layer 18, a magnetic recording layer 20 and a tunnel barrier wall layer 19 interposed between the magnetically fixed layer 18 and the magnetic recoding layer 20. A switching transistor (e.g., MOSFET) 5 having a gate electrode (read word line) 5 is connected to the magnetically fixed layer 18 via an upper electrode 31. Also, a write word line 13 is formed above and apart from the TMR element 24, and a bit line 23 connected to the magnetic recording layer 20 extends to cross the word line 13 at right angles.

Among the members constituting the TMR element, the magnetically fixed layer 18 and the tunnel barrier wall layer 19 are formed independent of the bit line 23. However, the magnetic recording layer 20 is formed integral with the bit line 23. In other words, the magnetic recording layer 20 is formed to extend in the direction of the bit line 23 without being separated for each cell and extends along the bit line 23. It follows that the magnetic recording layer 20 and the bit line 23 have the same shape.

It should be noted that it is possible for a part of the magnetic recording layer 20 to be included in the pattern of the TMR element 24 and for the remaining part of the magnetic recording layer 20 to be formed to extend in the direction of the bit line 23 without being separated for each cell so as to extend along the bit line 23 to cover at least two adjacent cells, as shown in FIG. 19B.

FIGS. 20A, 20B to 23A to 23B are cross sectional views collectively showing the manufacturing process of a semiconductor memory device according to the third embodiment of the present invention. These drawings include regions A and B. Regions A denote the cross sections along the line A—A shown in FIG. 19B, with regions B denoting the cross sections along the line B—B shown in FIG. 19B. The manufacturing method of the semiconductor memory device according to the third embodiment of the present invention will now be described with reference to FIGS. 20A, 20B to 23A, 23B.

Figure 20A:
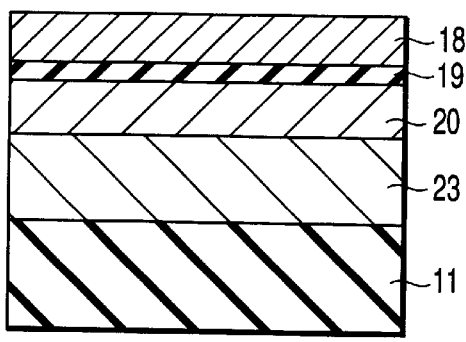
FIGS. 20A, 21A, 22A and 23A are cross sectional views along the line A—A shown in FIG. 19B collectively showing a method of manufacturing a semiconductor device according to the third embodiment of the present invention.
Figure 20B:
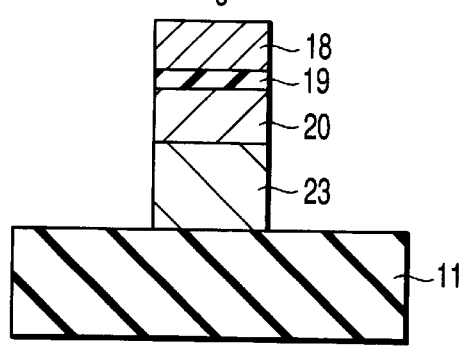
FIGS. 20B, 21B, 22B and 23B are cross sectional views along the line B—B shown in FIG. 19B collectively showing a method of manufacturing a semiconductor device according to the third embodiment of the present invention.

In the first step, a bit line 23, a magnetic recording layer 20, a tunnel barrier wall layer 19 and a magnetically fixed layer 18 are successively laminated in the order mentioned on a first interlayer insulating film 11, as shown in FIGS. 20A and 20B.

Figure 21A:
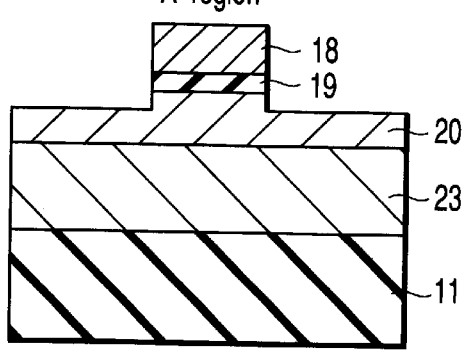
Figure 21B:
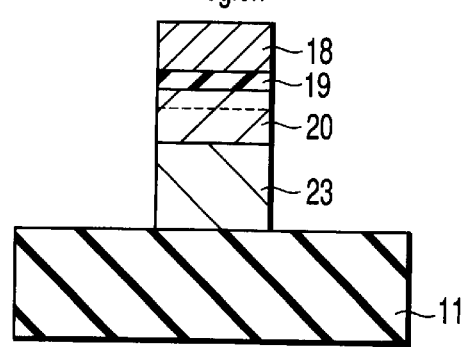

In the next step, the entire regions of the magnetically fixed layer 18 and the tunnel barrier wall layer 19 and a part of the magnetic recording layer 20 are patterned as shown in FIGS. 21A and 21B by a RIE method or an ion milling method, with a resist film (not shown) or a DLC film (not shown), which is patterned to conform with the pattern of the TMR element 24 shown in FIG. 19B, used as a mask. The etching for this patterning treatment is stopped when the surface of the magnetic recording layer 20 is exposed to the outside or when the magnetic recording layer 20 is slightly etched. It is desirable to employ an etching method that permits the tunnel barrier wall layer 19 and the magnetic recording layer 20 to differ from each other in the etching rate. Also, it is desirable for the magnetic recording layer 20 to have a thickness large enough to stop the etching when the etching is performed within the magnetic recording layer 20.

Figure 22A:
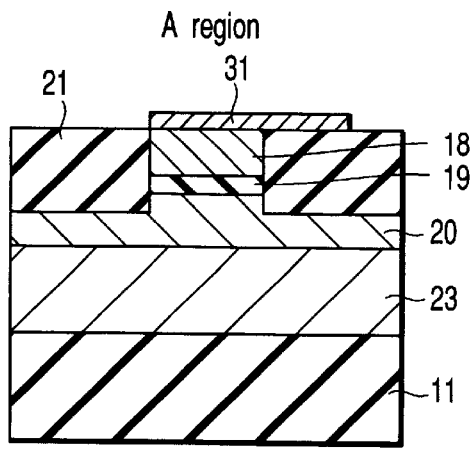
Figure 22B:
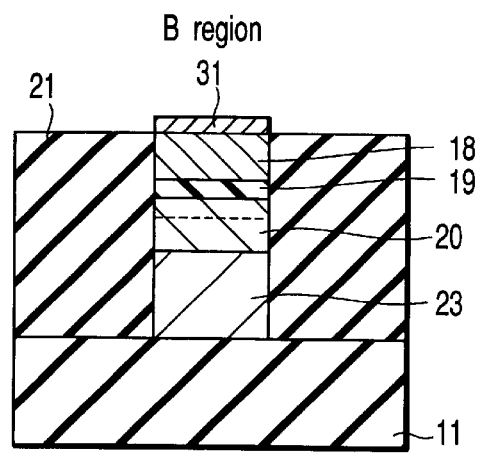

In the next step, a third interlayer insulating film 21 is deposited on the magnetic recording layer 20 and the magnetically fixed layer 18, as shown in FIGS. 22A and 22B. Then, the third interlayer insulating film 21 is flatted by, for example, a CMP method so as to expose the surface of the magnetically fixed layer 18. Further, an upper electrode 31 processed to conform to the pattern of the upper electrode 31 shown in FIG. 19B is formed.

Figure 23A:
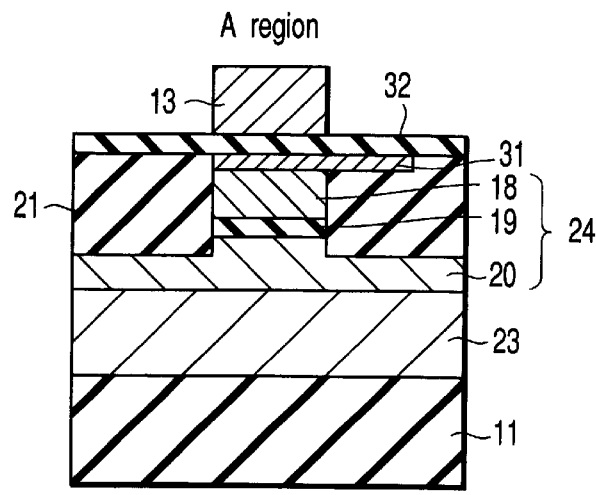
Figure 23B:
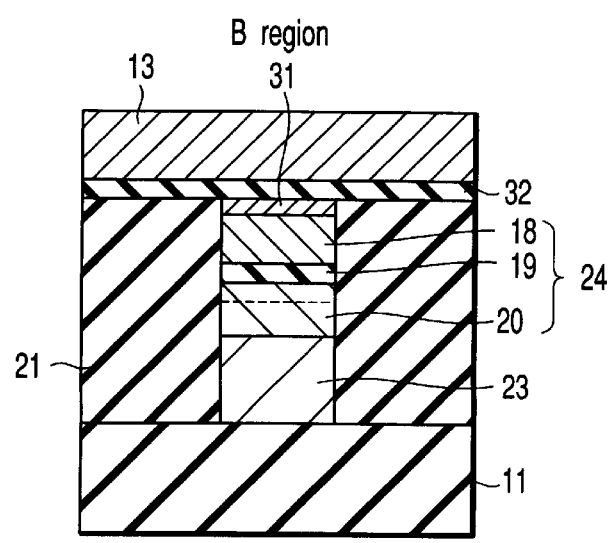

After formation of the upper electrode 31, a fourth interlayer insulating film 32 is formed thin and uniform on the upper electrode 31, as shown in FIGS. 23A and 23B, followed by forming a write word line 13 processed to conform to the pattern of the write word line 13 shown in FIG. 19B on the fourth interlayer insulating film 32.

According to the third embodiment of the present invention described above, the magnetic recording layer 20 is allowed to extend along the bit line 23 so as to permit the magnetized region to extend to a region intermediate between two adjacent cells. As a result, it is possible to provide the TRM element 24 that does not incur the influence of the signal deterioration caused by the magnetic pole generation without increasing the cell area.

Further, the manufacturing method of the semiconductor memory device according to the third embodiment of the present invention produces an additional effect. Specifically, in the first manufacturing method of the semiconductor memory device according to the first embodiment of the present invention, the bit line 23 and the magnetic recording layer 20 are collectively patterned. Therefore, the magnetic recording layer 20 and the bit line 23 are formed after the tunnel barrier wall layer 19, which is a thin film, is patterned and filled with the third interlayer insulating film 21. In other words, in the first manufacturing method of the semiconductor memory device according to the first embodiment of the present invention, it is impossible to form the bit line 23, the magnetic recording layer 20, the tunnel barrier wall layer 19 and the magnetically fixed layer 18 consecutively, followed by collectively patterning these layers. In the third embodiment of the present invention, however, it is possible to form the bit line the magnetic recording layer 20, the tunnel barrier wall layer 19 and the magnetically fixed layer 18 consecutively, followed by collectively patterning these layers. What should be noted is that it is possible to provide a process in which the manufacturing process need not be stopped during formation of the tunnel barrier wall layer 19, which is a thin film, in spite of the procedure that the bit line 23 and the magnetic recording layer 20 are formed consecutively. It follows that it is possible to further decrease the number of required process steps.

Further, in the third embodiment of the present invention, the magnetically fixed layer 18 is formed on the tunnel barrier wall layer 19. Therefore, when the s15 patterned magnetically fixed layer 18, the patterned tunnel barrier layer 19 and the patterned magnetic recording layer 20 are covered with the third interlayer insulating film 21, followed by flatting the third interlayer insulating film 21, damage is not generated in the tunnel barrier layer 19.

[Fourth Embodiment]

The fourth embodiment differs from the third embodiment simply in that the positions of the magnetically fixed layer 18 and the magnetic recording layer 20 are reversed.

FIGS. 24A and 24B are oblique views schematically showing the construction of the semiconductor memory device according to the fourth embodiment of the present invention.

As shown in FIG. 24A, the semiconductor memory device according to the fourth embodiment of the present invention is directed to an MRAM using as a memory element a TMR element 24 comprising a magnetically fixed layer 18, a magnetic recording layer 20 and a tunnel barrier wall layer 19 interposed between the magnetically fixed layer 18 and the magnetic recording layer 20. A switching transistor (e.g., MOSFET) 5 having a gate electrode (read word line) 3 is connected to the magnetic recording layer 20 through an upper electrode 31. Also, a write word line 13 is arranged apart from and above the TMR element 24, and a bit line 23 connected to the magnetically fixed layer 18 is arranged to extend to cross the word line 13 at right angles.

Among the members constituting the TMR element 24, the magnetic recording layer 20 and the tunnel barrier wall layer 19 are formed independent of the bit line 23. However, the magnetically fixed layer 18 is formed integral with the bit line 23. In other words, the magnetically fixed layer 18 is formed to extend in the direction of the bit line 23 without being separated for each cell and extends along the bit line 23. It follows that the magnetically fixed layer 18 and the bit line 23 have the same shape.

It should be noted that it is possible for a part of the magnetically fixed layer 18 to be included in the pattern of the TMR element 24 and for the remaining part of the magnetically fixed layer 18 to extend in the direction of the bit line 23 without being separated for each cell and to extend along the bit line 23 to cover at least two adjacent cells.

The manufacturing method of the semiconductor memory device according to the third embodiment of the present invention can be employed for the manufacture of the semiconductor memory device according to the fourth embodiment of the present invention by interchanging the magnetically fixed layer 18 and the magnetic recording layer 20 in the manufacturing method of the semiconductor memory device according to the third embodiment of the present invention. Therefore, the manufacturing method of the semiconductor memory device according to the fourth embodiment of the present invention is omitted.

The fourth embodiment of the present invention permits producing the effects similar to those produced by the first embodiment of the present invention. Further, in the fourth embodiment of the present invention, the magnetically fixed layer 18 having the direction of magnetization fixed in one direction is allowed to extend along the bit line 23. Therefore, the magnetic vector of the magnetically fixed layer 18 is unlikely to incur the influence of the processing for miniaturizing the semiconductor memory device so as to make it possible to form the magnetically fixed layer 18 with high stability.

It should also be noted that, in the fourth embodiment of the present invention, it is possible to form successively the bit line 23, the magnetically fixed layer 18, the tunnel barrier wall layer 19 and the magnetic recording layer 20 and to pattern these layers. It follows that it is possible to provide a process in which the process step need not be stopped during formation of the tunnel barrier wall layer 19, which is a thin film, in spite of the procedure that the bit line 23 and the magnetically fixed layer 18 are formed consecutively, as in the third embodiment of the present invention. As a result, the number of process steps can be further decreased.

[Fifth Embodiment]

The semiconductor memory device according to the fifth embodiment of the present invention comprises a TMR element having a double tunnel barrier wall layer.

FIGS. 25A and 25B are oblique views schematically showing the construction of a semiconductor memory device according to the fifth embodiment of the present invention.

As shown in FIG. 25A, the semiconductor memory device according to the fifth embodiment of the present invention is directed to an MRAM using as a memory element a TMR element 55 comprising a first magnetically fixed layer 51, a second magnetically fixed layer 54, a magnetic recording layer 20, a first tunnel barrier wall layer 52 sandwiched between the first magnetically fixed layer 51 and the second magnetically fixed layer 54, and a second tunnel barrier wall layer 53 sandwiched between the second magnetically fixed layer 54 and the magnetic recording layer 20. A switching transistor (e.g., MOSFET) 5 having a gate electrode (read word line) 3 is connected to the first magnetically fixed layer 51 through a lower electrode 17. Also, a write word line 13 is arranged apart from and below the TMR element 55, and a bit line 23 connected to the second magnetically fixed layer 54 is arranged to cross the word line 13 at right angles.

Among the members constituting the TMR element 55, the magnetic recording layer 20, the first magnetically fixed layer 51, the first tunnel barrier wall 52 and the second tunnel barrier wall 53 are formed independently of the bit line 23. However, the second magnetically fixed layer 54 is formed integral with the bit line 23. In other words, the second magnetically fixed layer 54 is formed to extend in the direction of the bit line 23 without being separated for each cell and extends along the bit line 23. It follows that the second magnetically fixed layer 54 and the bit line 23 have the same shape.

It should be noted that it is possible to divide the second magnetically fixed layer 54 into a first pattern portion 54A and a second pattern portion 54B. In this case, the first pattern portion 54A of the second magnetically fixed layer is included in the pattern of the TMR element 55, and the second pattern portion 54B of the second magnetically fixed layer is formed to extend in the direction of the bit line 23 without being separated for each cell and extends along the bit line 23 to cover at least two adjacent cells.

Figure 26A:
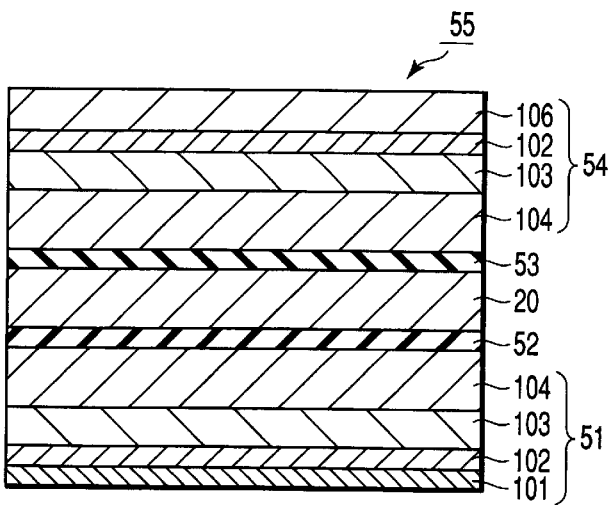
FIGS. 26A and 26B are cross sectional views Collectively showing a TMR element having a double tunnel barrier wall layer according to the fifth embodiment of the present invention.
Figure 26B:
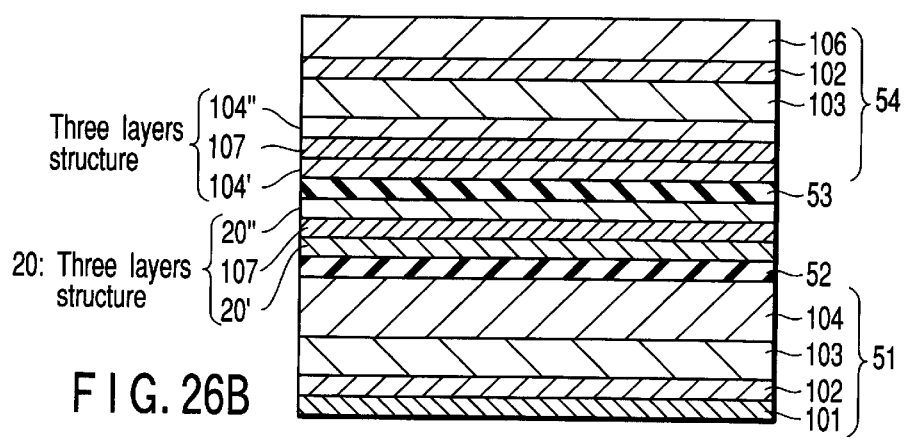

FIGS. 26A and 267B are cross sectional views showing a TMR element having a double tunnel wall layer. It is desirable for the TMR element 55 having a double tunnel barrier wall layer to be constructed as shown in FIGS. 26A and 26B. The construction of the TMR element 55 having a double tunnel barrier wall layer will now be described.

The TMR element 55 shown in FIG. 26 comprises a first magnetically fixed layer 51 including a template layer 101, an initial ferromagnetic layer 02, an antiferromagnetic layer 103 and a reference ferromagnetic layer 10, which are laminated one upon the other in the order mentioned, a first tunnel barrier wall layer 52 formed on the first magnetically fixed layer 51, a magnetic recording layer 20 formed on the first tunnel barrier wall layer 52, a second tunnel barrier wall layer 53 formed on the magnetic recording layer 20, and a second magnetically fixed layer 54 formed on the second tunnel barrier wall layer 53 and including a reference ferromagnetic layer 104, an antiferromagnetic layer 103, an initial ferromagnetic layer 102, and a contact layer 106, which are laminated one upon the other in the order mentioned.

On the other hand, the TMR element 55 shown in FIG. 26B comprises a first magnetically fixed layer 51 including a template layer 101, an initial ferromagnetic layer 102, an antiferromagnetic layer 103, and a reference ferromagnetic layer 104, which are laminated one upon the other in the order mentioned, a first tunnel barrier wall layer 52 formed on the first magnetically fixed layer 51, a magnetic recording layer 20 of a three layer structure formed on the first tunnel barrier wall layer 52 and including a ferromagnetic layer 20', a nonmagnetic layer 107, and a ferromagnetic layer 20", which are laminated one upon the other in the order mentioned, a second tunnel barrier wall layer 53 formed on the magnetic recording layer 20, and a second magnetically fixed layer 54 formed on the second tunnel barrier wall layer 53 and including a ferromagnetic layer 104', a nonmagnetic layer 107, a ferromagnetic layer 104", an antiferromagnetic layer 103, an initial ferromagnetic layer 102 and a contact layer 106, which are laminated one upon the other in the order mentioned.

It should be noted that the three layer structure including the ferromagnetic layer 20', the nonmagnetic layer 107 and the ferromagnetic layer 20", which constitutes the magnetic recording layer 20, and another three layer structure including the ferromagnetic layer 104', the nonmagnetic layer 107 and the ferromagnetic layer 104", which is included in the second magnetically fixed layer 54, are introduced into the TMR element 55 shown in FIG. 26B. The particular construction makes it possible to suppress the generation of a magnetic pole inside the ferromagnetic layer so as to provide a cell structure more adapted for the miniaturization of the semiconductor memory device, compared with the TMR element 55 shown in FIG. 26A.

In the case of using the TMR element 55 having the particular double tunnel barrier wall layer described above, it is possible to suppress the MR ratio when the same external bias is applied to the semiconductor memory device so as to allow the semiconductor memory device to operate under a higher bias, compared with the case of using the TMR element 24 having a single tunnel barrier wall layer. In other words, the semiconductor memory device including the TMR element 55 having the particular double tunnel barrier wall layer is advantageous when the cell information is read to the outside.

It should be noted that it is possible to use the construction of the TMR element 55 having the double tunnel barrier wall layer shown in FIG. 26A or 26B in semiconductor memory devices of other embodiments.

FIGS. 27 to 31 are cross sectional views along the line XXXI—XXXI shown in FIG. 25A collectively showing a first manufacturing method of the semiconductor memory device according to the fifth embodiment of the present invention. The first manufacturing method of the semiconductor memory device according to the fifth embodiment of the present invention will now be described with reference to FIGS. 27 to 31.

Figure 27:
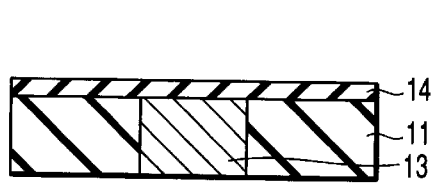
FIGS. 27, 28, 29, 30 and 31 are cross sectional views collectively showing a first method of manufacturing a semiconductor memory device according to the fifth embodiment of the present invention.

In the first step, a write word line 13 is selectively formed in a first interlayer insulating film 11, followed by depositing a second interlayer insulating film 14 on the word line 13 and within a gap portion (not shown), as shown in FIG. 27.

Figure 28:
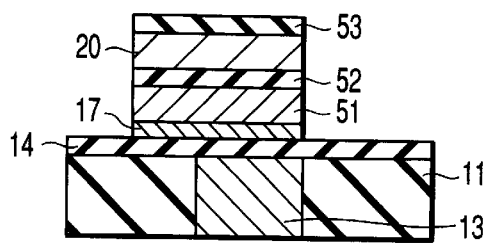
Figure 30:
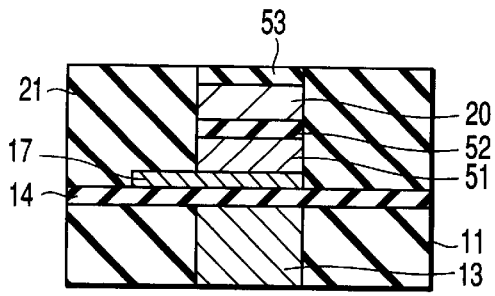

In the next step, a lower electrode 17, a first magnetically fixed layer 51, a first tunnel barrier wall layer 52, a magnetic recording layer 20 and a second tunnel barrier wall layer 53 are consecutively formed on the second interlayer insulating film 14, as shown in FIG. 28. It should be noted that each of the first and second magnetically fixed layers 51, 54 and the magnetic recording layer 20 is of a laminate structure consisting of a plurality of films as shown in FIGS. 26A and 26B. However, each of these first and second magnetically fixed layers 51, 54 and magnetic recording layer 20 is depicted as a single layer in FIG. 28. Then, the second tunnel barrier wall layer 53, the magnetic recording layer 20, the first tunnel barrier wall layer 52, the first magnetically fixed layer 51 and the lower electrode 17 are collectively patterned by a RIE method or an ion milling method, with a resist film or a DLC film, which is patterned to conform to the pattern of the lower electrode 17 shown in FIG. 25A, used as a mask.

Figure 29:
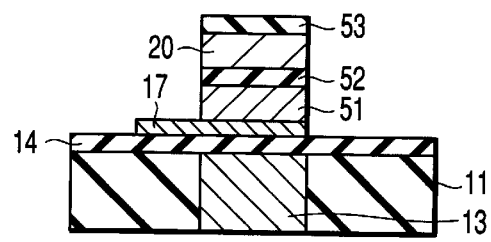

Further, the second tunnel barrier wall layer 53, the magnetic recording layer 20, the first tunnel barrier wall layer 52 and the first magnetically fixed layer 51 are collectively patterned by a RIE method or an ion milling method, with a resist film or a DLC film, which is patterned to conform to the pattern of the TMR element 24 shown in FIG. 25A, used as a mask, as shown in FIG. 29.

In the next step, a third interlayer insulating film 21 is deposited on the second interlayer insulating film 14, the lower electrode 17 and the second tunnel barrier wall layer 53, with the mask, which was used for patterning the second tunnel barrier wall layer 53, the magnetic recording layer 20, the first tunnel barrier wall layer 52, and the first magnetically fixed layer 51, left unremoved. As a result, the gaps of the patterned second tunnel barrier wall layer 53, the patterned magnetic recording layer 20, the patterned first tunnel barrier wall layer 52 and the patterned first magnetically fixed layer 51 are filled with the third interlayer insulating film 21. Then, the third interlayer insulating film 21 is flatted by a CMP method, with the mask used as a stopper, followed by removing the mask.

Figure 31:
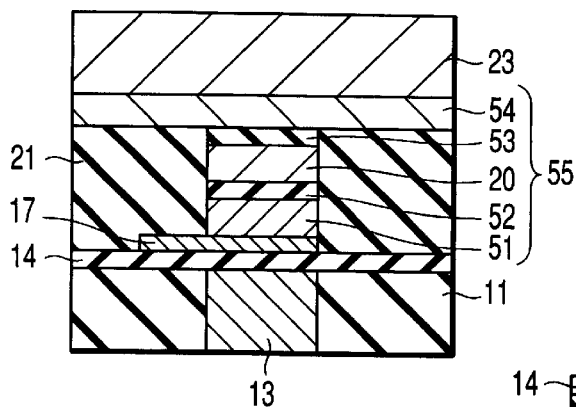
Figure 34:
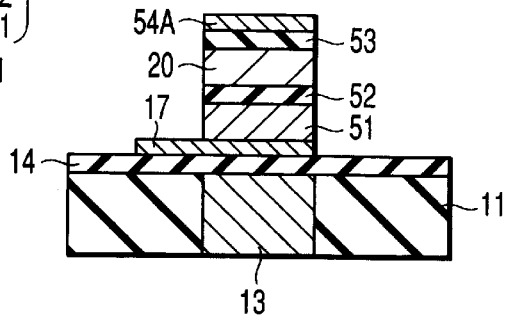
FIGS. 32, 33, 34, 35 and 36 are cross sectional views collectively showing a second method of manufacturing a semiconductor memory device according to the fifth embodiment of the present invention.

Finally, a second magnetically fixed layer 54 and a metal material layer for a bit line 23 are deposited on the second tunnel barrier wall layer 53 and the third interlayer insulating film 21 by, for example, a sputtering method, as shown in FIG. 31. Then, the second magnetically fixed layer 54 and the metal material layer for the bit line 23 are collectively patterned by the photolithography technology by using a resist layer patterned to conform to the pattern of the bit line 23 shown in FIG. 25A. As a result, the second magnetically fixed layer 54 and the bit line 23 are formed, thereby forming the TMR element 55 of the double structure.

FIGS. 32 to 36 are cross sectional views along the line XXXVI—XXXVI shown in FIG. 25B collectively showing a second manufacturing method of the semiconductor memory device according to the fifth embodiment of the present invention. In the second manufacturing method, the second pattern portion 54B alone of the second magnetically fixed layer is allowed to extend along the bit line 23. The second manufacturing method of the semiconductor memory device according to the fifth embodiment of the present invention will now be described with reference to FIGS. 27 to 31.

Figure 32:
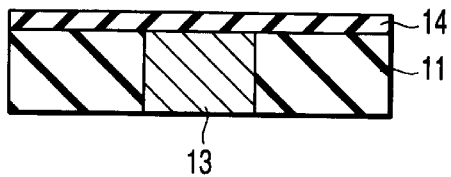
Figure 35:
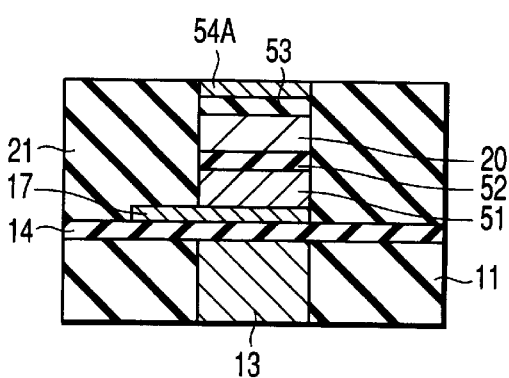

In the first step, a write word line 13 is selectively formed in a first interlayer insulating film 11, followed by depositing a second interlayer insulating film 14 on the word line 13 and within a gap portion (not shown), as shown in FIG. 32.

Figure 33:
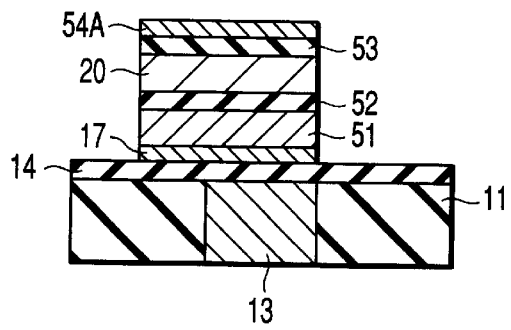

In the next step, a lower electrode 17, a first magnetically fixed layer 51, a first tunnel barrier wall layer 52, a magnetic recording layer 20, a second tunnel barrier wall layer 53, and a first pattern portion 54A of the second magnetically fixed layer are consecutively formed on the second interlayer insulating film 14, as shown in FIG. 33. Then, the first pattern portion 54A of the second magnetically fixed layer, the second tunnel barrier wall layer 53, the magnetic recording layer 20, the first tunnel barrier wall layer 52, the first magnetically fixed layer 51 and the lower electrode 17 are collectively patterned by a RIE method or an ion milling method, with a resist film or a DLC film, which is patterned to conform to the pattern of the lower electrode 17 shown in FIG. 25A, used as a mask.

Further, the first pattern portion 54A of the second magnetically fixed layer, the second tunnel barrier wall layer 53, the magnetic recording layer 20, the first tunnel barrier wall layer 52, and the first magnetically fixed layer 51 are collectively patterned as in the first manufacturing method by a RIE method or an ion milling method, with a resist film (not shown) or a DLC film (not shown), which is patterned to conform to the pattern of the TMR element 55 shown in FIG. 25B, used as a mask.

In the next step, a third interlayer insulating film 21 is deposited as in the first manufacturing method on the first pattern portion 54A of the second magnetically fixed layer, the lower electrode 17 and the second interlayer insulating film, followed by flatting the third interlayer insulating film thus deposited.

Figure 36:
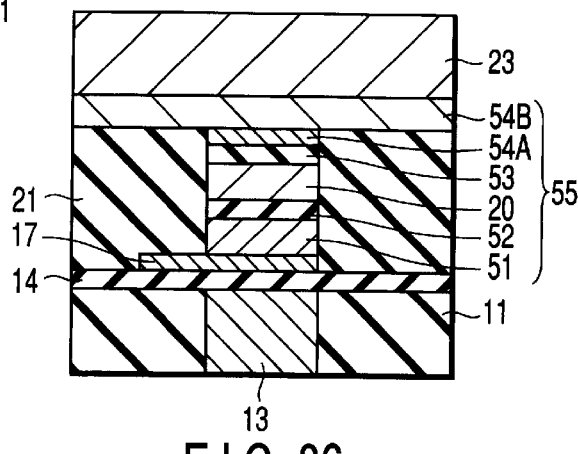

In the next step, a second pattern portion 54B of the second magnetically fixed layer and a bit line 23 are formed by the method similar to that employed in the first manufacturing method so as to finish manufacture of a TMR element 55 of a double structure, as shown in FIG. 36.

It should be noted that a part of the second magnetic recording layer (first pattern portion 54A of the second magnetically fixed layer) is already processed together with the TMR element 55. Therefore, in carrying out the process shown in FIG. 36, it is necessary in some cases to adjust the thickness of the second pattern portion 54B of the second magnetically fixed layer that is patterned together with the bit line 23.

The fifth embodiment of the present invention described above permits producing the effects similar to those produced by the first embodiment of the present invention.

Further, in the fifth embodiment of the present invention, the second magnetically fixed layer 54 or 54B having the direction of magnetization fixed in one direction is allowed to extend along the bit line 23. Therefore, the magnetic vector of the second magnetically fixed layer 54 or 54B is unlikely to incur the influence of the processing for miniaturizing the semiconductor memory device so as to make it possible to form the second magnetically fixed layer 54 or 54B with high stability.

Also, the fifth embodiment is directed to the TMR element 55 having a double tunnel barrier wall layer. Therefore, the TMR element 55 is capable of retaining a high MR ratio and is free from deterioration of the characteristics even if a voltage is applied thereto. It follows that the fifth embodiment of the present invention provides a semiconductor memory device superior to the TMR element 24 having a single tunnel barrier wall layer in breakdown voltage characteristics.

Also, in the second manufacturing method of the semiconductor memory device according to the fifth embodiment of the present invention, the first pattern portion 54A of the second magnetic recording layer is formed on the second tunnel barrier layer 53 as in the second manufacturing method of the semiconductor memory device according to the first embodiment of the present invention. Therefore, in flatting the third interlayer insulating film 21 (step shown in FIG. 35), the second tunnel barrier wall layer 53 can be protected by the first pattern portion 54A of the second magnetic recording layer. It follows that, in the second manufacturing method of the semiconductor memory device according to the fifth embodiment of the present invention, it is possible to prevent the second tunnel barrier wall layer 53 from being damaged so as to improve the reliability of the element without deteriorating the quality of the second tunnel barrier wall layer 53.

[Sixth Embodiment]

In the sixth embodiment, a bit line 23 and a first magnetically fixed layer 51 are collectively formed before formation of a write word line 13 and a second magnetically fixed layer 54. Also, used in the sixth embodiment is a TMR element 55 having a double tunnel barrier wall layer as in the fifth embodiment described above.

Figure 37A:
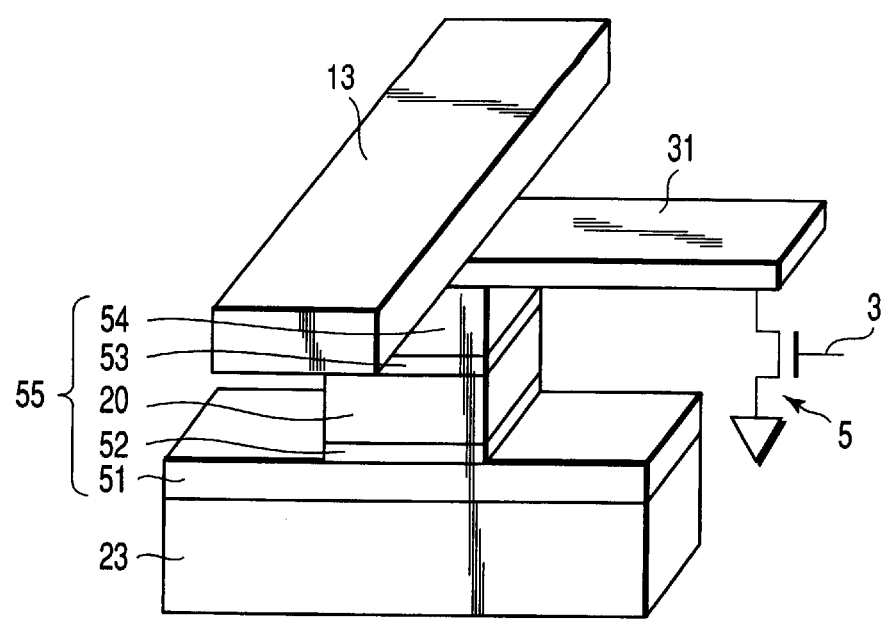
FIGS. 37A and 37B are oblique views collectively showing schematically the construction of a semiconductor memory device according to a sixth embodiment of the present invention.
Figure 37B:
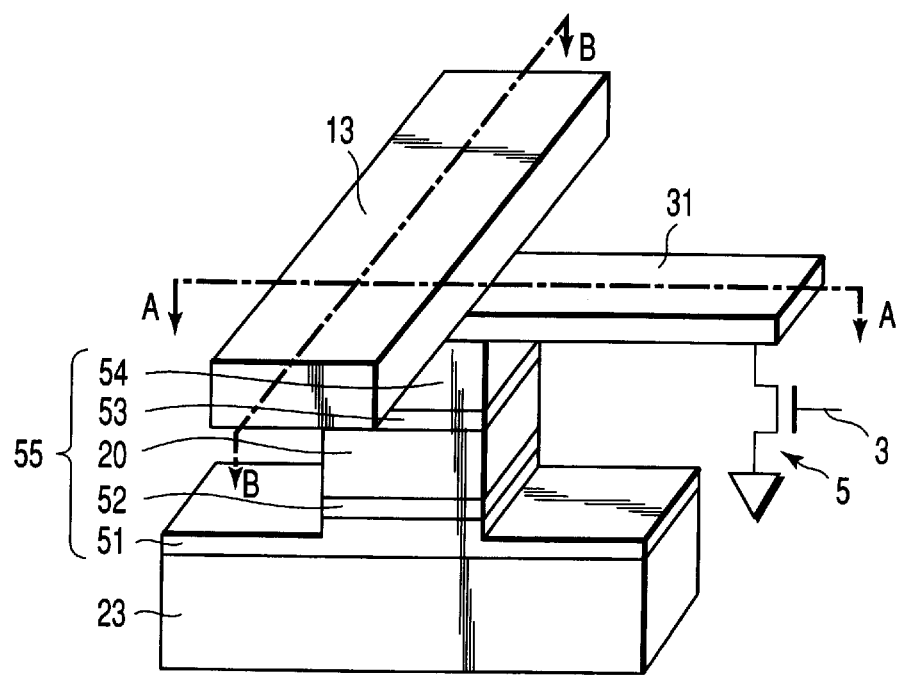

FIGS. 37A and 37B are oblique views schematically showing a semiconductor memory device according to the sixth embodiment of the present invention.

As shown in FIG. 37A, the semiconductor memory device according to the sixth embodiment of the present invention is directed to an MRAM using as a memory element a TMR element 55 including a first magnetically fixed layer 51, a second magnetically fixed layer 54, a magnetic recording layer 20, a first tunnel barrier wall layer 52 sandwiched between the first magnetically fixed layer 51 and the magnetic recording layer 20, and a second tunnel barrier wall layer 53 sandwiched between the second magnetically fixed layer 54 and the magnetic recording layer 20. A switching transistor (e.g., a MOSFET) 5 having a gate electrode (read word line) 3 is connected to the second magnetically fixed layer 54 through an upper electrode 31. Also, a write word line 13 is arranged apart from and above the TMR element 55, and a bit line 23 connected to the first magnetically fixed layer 51 is arranged to cross the word line 13 at right angles.

Among the members constituting the TMR element 55, the magnetic recording layer 20, the second magnetically fixed layer 54, the first tunnel barrier wall 52 and the second tunnel barrier wall 53 are formed independently of the bit line 23. However, the first magnetically fixed layer 51 is formed integrally with the bit line 23. In other words, the first magnetically fixed layer 51 is formed to extend in the direction of the bit line 23 without being separated for each cell and extends along the bit line 23. It follows that the first magnetically fixed layer 51 and the bit line 23 have the same shape.

It should be noted that it is possible for a part of the first magnetically fixed layer 51 to be included in the pattern of the TMR element 24 and for the remaining part of the first magnetically fixed layer 51 to be formed to extend in the direction of the bit line 23 without being separated for each cell and to extend along the bit line 23 to cover at least two adjacent cells, as shown in FIG. 37B.

FIGS. 38A, 38B to FIGS. 41A, 41B are cross sectional views collectively showing a manufacturing process of a semiconductor memory device according to the sixth embodiment of the present invention. These drawings include regions A and B. Region A represents the cross section along the line A—A shown in FIG. 37B. On the other hand, region B represents the cross section along the line B—B shown in FIG. 37B. A manufacturing method of the semiconductor memory device according to the sixth embodiment of the present invention will now be described with reference to FIGS. 38A, 38B to 41A, 41B.

Figure 38A:
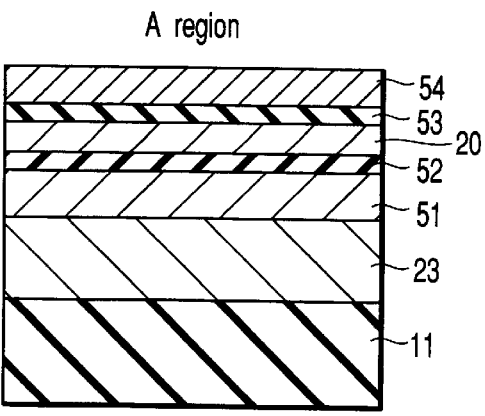
FIGS. 38A, 39A, 40A and 41A are cross sectional views along the line A—A shown in FIG. 37B collectively showing a method of manufacturing a semiconductor memory device according to the sixth embodiment of the present invention.
Figure 38B:
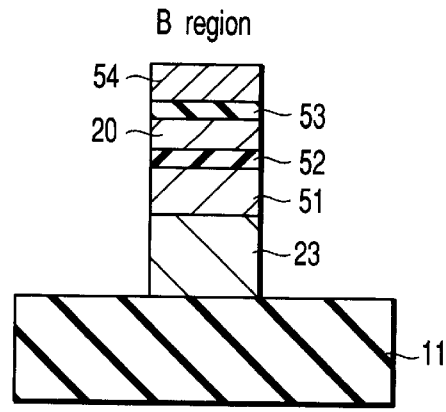
FIGS. 38B, 39B, 40B and 41B are cross sectional views along the line B—B shown in FIG. 37B collectively showing a method of manufacturing a semiconductor memory device according to the sixth embodiment of the present invention.
Figure 39A:
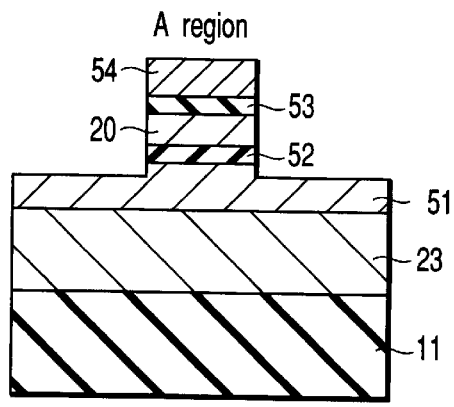
Figure 39B:
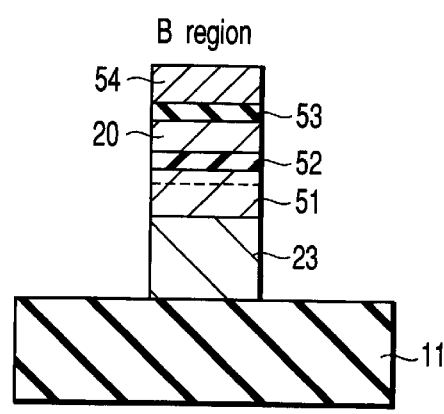

In the first step, a bit line 23, a first magnetically fixed layer 51, a first tunnel barrier wall layer 52, a magnetic recording layer 20, a second tunnel barrier wall layer 53 and a second magnetically fixed layer 54 are successively formed on a first interlayer insulating film 11 in the order mentioned, as shown in FIGS. 38A and 38B.

In the next step, the entire regions of the second magnetically fixed layer 54, the second tunnel barrier wall layer 53, the magnetic recording layer 20 and the first tunnel barrier wall layer 52 and a part of the first magnetically fixed layer 51 are collectively patterned by a RIE method or an ion milling method, with a resist film (not shown) or a DLC film (not shown), which is patterned to conform to the pattern of the TMR element 55 shown in FIG. 37B, used as a mask. The particular etching treatment for the patterning is stopped when the surface of the first magnetically fixed layer 51 is exposed to the outside or when the first magnetically fixed layer 51 is slightly etched. It is desirable to employ the etching method that permits the first tunnel barrier wall layer 52 and the first magnetically fixed layer 51 to differ from each other in the etching rate. Also, it is desirable for the first magnetically fixed layer 51 to have a thickness large enough to stop the etching during the etching process of the first magnetically fixed layer 51.

Figure 40A:
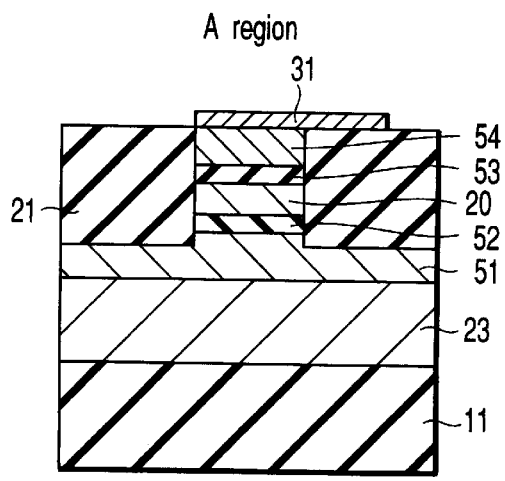
Figure 40B:
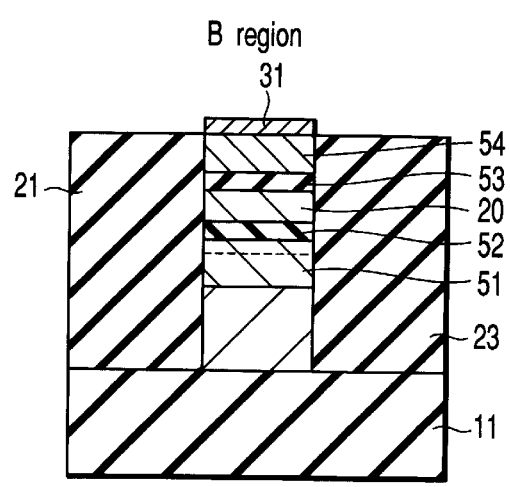

In the next step, a third interlayer insulating film 21 is deposited to cover the first magnetically fixed layer 51 and the second magnetically fixed layer 54, as shown in FIGS. 40A and 40B, followed by flatting the third interlayer insulating film 21 by, for example, a CMP method so as to permit the surface of the second magnetically fixed layer to be exposed to the outside. Then, an upper electrode 31 patterned to conform to the pattern of the upper electrode 31 shown in FIG. 37B is formed on the exposed surface of the second magnetically fixed layer 54.

Figure 41A:
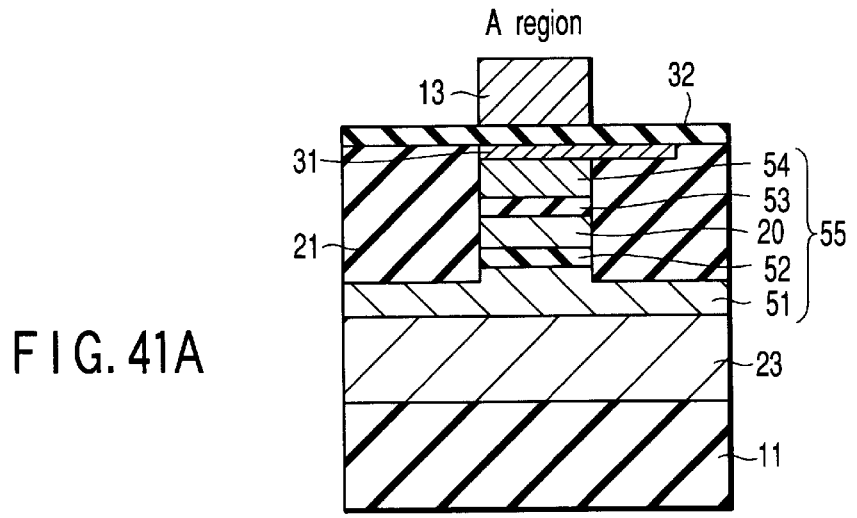
Figure 41B:
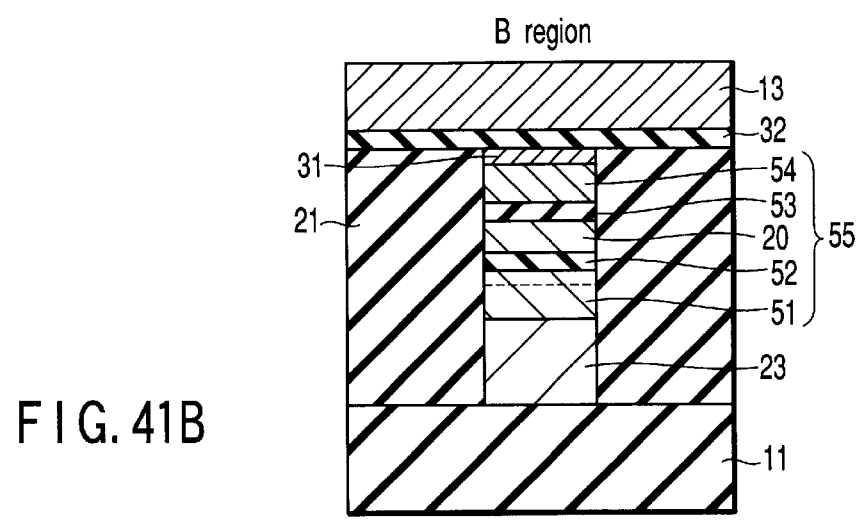

After formation of the upper electrode 31, a fourth interlayer insulating layer 32 is formed thinly and uniformly on the upper electrode 31, as shown in FIGS. 41A and 41B. Then, a write word line 13 processed to have a pattern conforming to the pattern of the write word line 13 shown in FIG. 37B is formed on the fourth interlayer insulating film 32.

The sixth embodiment of the present invention described above permits producing effects similar to those produced by the first embodiment of the present invention.

Further, in the sixth embodiment of the present invention, the first magnetically fixed layer 51 having the direction of magnetization fixed in one direction is allowed to extend along the bit line 23. Therefore, the magnetic vector of the first magnetically fixed layer 51 is unlikely to incur the influence of the processing for miniaturizing the semiconductor memory device so as to make it possible to form the first magnetically fixed layer 514 or 54B with high stability.

Also, in the sixth embodiment of the present invention, the second magnetic recording layer 54 is formed on the second tunnel barrier layer 53 as in the second manufacturing method of the semiconductor memory device according to the first embodiment of the present invention. Therefore, in flatting the third interlayer insulating film 21 (step shown in FIG. 35), the second tunnel barrier wall layer 53 can be protected by the second magnetic recording layer 54. It follows that, in the second manufacturing method of the semiconductor memory device according to the sixth embodiment of the present invention, it is possible to prevent the second tunnel barrier wall layer 53 from being damaged so as to improve the reliability of the element without deteriorating the quality of the second tunnel barrier wall layer 53.

[Seventh Embodiment]

In the seventh embodiment, a bit line and a magnetic recording layer are allowed to extend integrally to the outside of a TMR element, and a constricted portion is formed in the extending portion.

Figure 42:
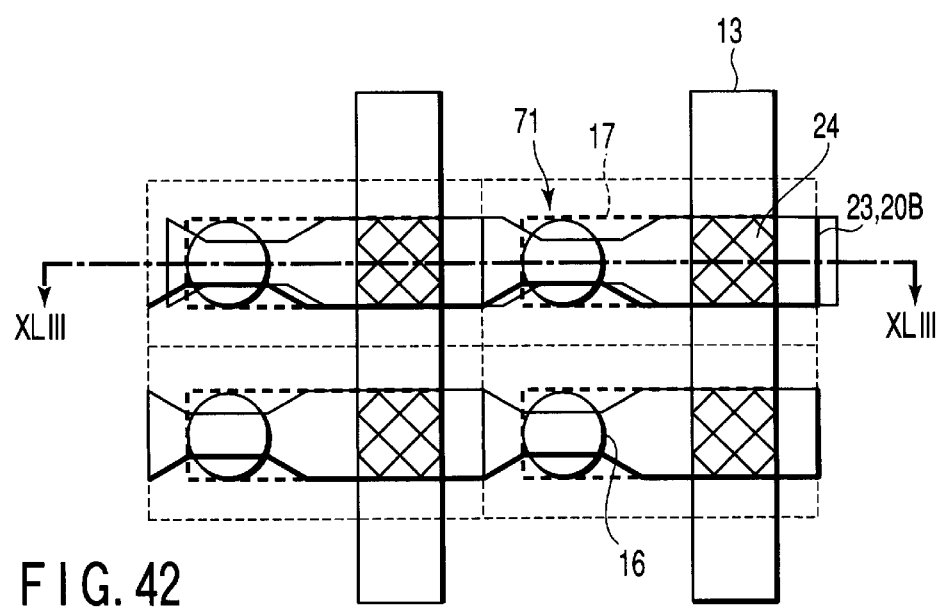
FIG. 42 is a plan view showing a semiconductor memory device according to a seventh embodiment of the present invention.

FIG. 42 is a plan view showing a semiconductor memory device according to the seventh embodiment of the present invention. On the other hand, FIG. 43 is a cross sectional view showing the semiconductor memory device along the line XLIII—XLIII shown in FIG. 42.

Figure 43:
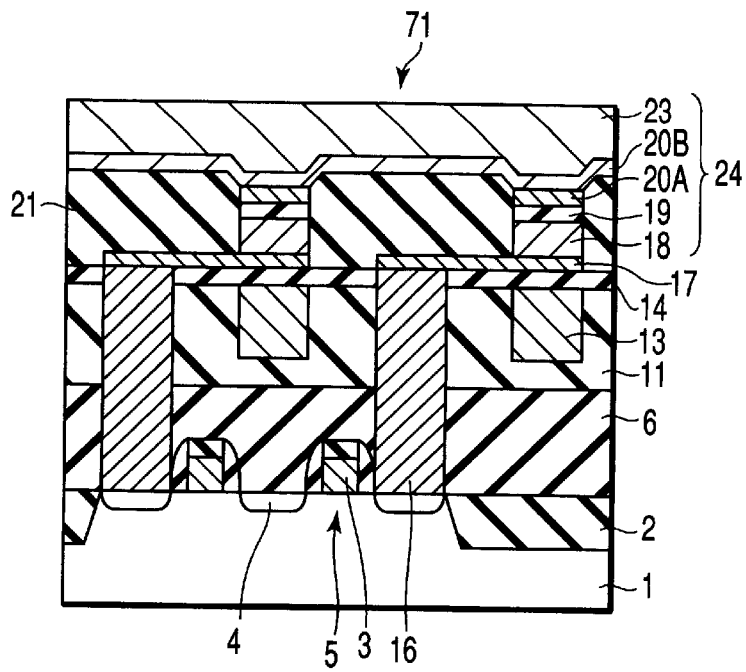
FIG. 43 is a cross sectional view showing a semiconductor memory device along the line XLIII—XLIII shown in FIG. 42.

As shown in FIGS. 42 and 43, the semiconductor memory device according to the seventh embodiment of the present invention is directed to an MRAM using as a memory element a TMR element 24 including a magnetically fixed layer 18, a magnetic recording layers 20A, 20B, and a tunnel barrier wall layer 19 sandwiched between the magnetically fixed layer 18 and the magnetic recording layer 20A. A lower electrode 17 is connected to the magnetically fixed layer 18, and the source or drain region 4 of a switching transistor (e.g., a MOSFET) 5 having a gate electrode (read word line) 3 is connected to the lower electrode 17 through a contact 16. Also, a write word line 13 is formed apart from and below the TMR element 24, and a bit line 23 connected to the magnetic recording layers 20A, 20B is arranged to cross the word line 13 at right angles.

Among the members constituting the TMR element 24, the magnetically fixed layer 18, the tunnel barrier wall layer 19 and the first pattern portion 20A of the magnetic recording layer are formed independently of the bit line 23. However, the second pattern portion 20B of the magnetic recording layer is formed integrally with the bit line 23. In other words, the second pattern portion 20B of the magnetic recording layer is formed to extend in the direction of the bit line 23 without being separated for each cell and extends along the bit line 23. Also, a constricted portion 71, which is somewhat narrower than the other portion, is formed in the pattern of a laminate structure consisting of the bit line 23 and the second pattern portion 20B of the magnetic recording layer such that the constricted portion 71 is positioned between the adjacent TMR elements 24.

FIGS. 44 to 48 are cross sectional views along the line XLIII—XLIII shown in FIG. 42 collectively showing the manufacturing method of a semiconductor device according to the seventh embodiment of the present invention. A manufacturing method of the semiconductor memory device according to the seventh embodiment of the present invention will now be described with reference to FIGS. 44 to 48.

Figure 44:
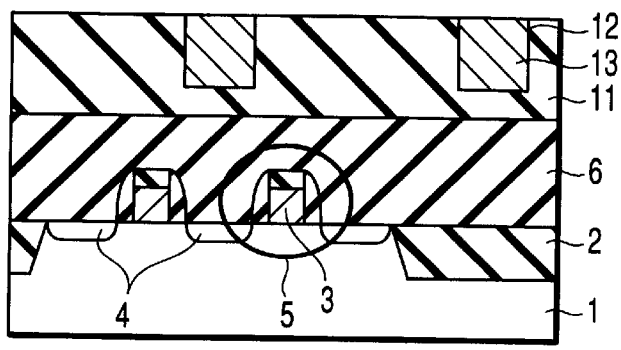
FIGS. 44, 45, 46, 47 and 48 are cross sectional views collectively showing a method of manufacturing a semiconductor memory device according to a seventh embodiment of the present invention.

In the first step, an element isolating region 2 is formed in a semiconductor substrate 1, followed by forming a gate electrode 3 and source-drain regions 4, thereby forming a MOSFET 5 on the semiconductor substrate 1, as shown in FIG. 44. Then, a first interlayer insulating film 6 is deposited on the entire surface so as to cover the MOSFET 5, followed by flatting the surface of the first interlayer insulating film 6 by, for example, a CMP method. Further, a second interlayer insulating film 11 is formed on the first interlayer insulating film 6, and a groove 12 for a write word line is formed in the second interlayer insulating film 11. The groove 12 for the write word line is patterned by a lithography method and a RIE method to conform to the shape of the write word line 13 shown in FIG. 42. Then, a metal material for forming the write word line is deposited on the entire surface by a sputtering method so as to fill the groove 12 for the write word line with the deposited metal material, followed by flatting the deposited metal material layer by a CMP method until the surface of the second interlayer insulating film 11 is exposed to the outside so as to form the write word line 13 within the second interlayer insulating film 11.

Figure 45:
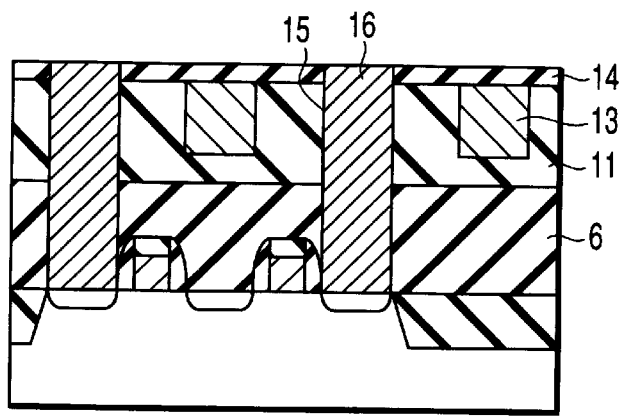

In the next step, a third interlayer insulating film 14 is formed by, for example, a CVD method to cover the second interlayer insulating film 11 and the write word line 13, as shown in FIG. 45. Then, a resist film (not shown) is formed on the third interlayer insulating film 14, followed by patterning the resist film to conform to the pattern of the contact 16 shown in FIG. 42. Further, the third interlayer insulating film 14, the second interlayer insulating film 11 and the first interlayer insulating film 6 are consecutively removed by a RIE method with the patterned resist film used as a mask. As a result, contact holes 15 are formed exposing the surfaces of the source-drain regions 4 to the outside. Still further, a film of a laminate structure consisting of a barrier metal film and a metal film (W film) is deposited in a thickness of, for example, hundreds of angstroms within the contact holes 15 and on the third interlayer insulating film 14 so as to fill the contact holes with the film of the laminate structure, followed by flatting the film of the laminate structure by a CMP method until the surface of the third interlayer insulating film 14 is exposed to the outside. As a result, formed are the contacts 16 connected to the source-drain regions 4.

Figure 46:
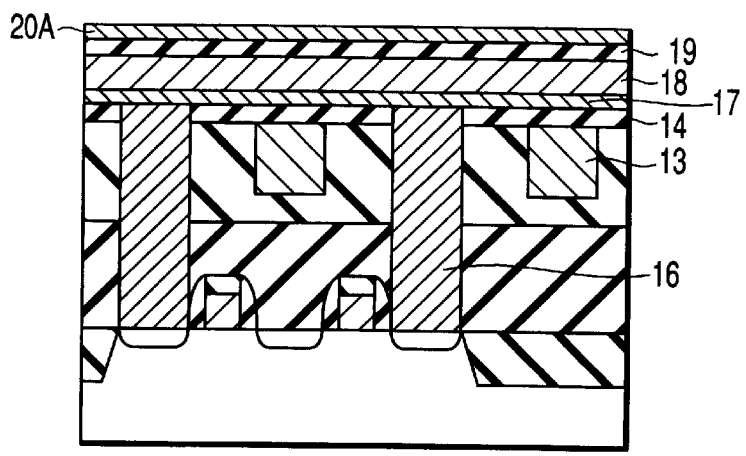

In the next step, a lower electrode 17, a magnetically fixed layer 18, a tunnel barrier wall layer 19 and a first pattern portion 20A of a magnetic recording layer are consecutively formed on the third interlayer insulating film 14 and the contacts 16, as shown in FIG. 46. It should be noted that the magnetically fixed layer 18 is of a laminate structure including a plurality of films as shown in FIGS. 2A and 2B. However, the magnetically fixed layer 18 is depicted as a single layer in FIG. 46 for the sake of brevity.

Then, a resist film (not shown) is formed on the first pattern portion 20A of the magnetic recording layer, followed by patterning the resist film by using photolithography technology to conform to the pattern of the lower electrode 17 shown in FIG. 42. Alternatively, a hard mask such as a DLC (diamond like carbon) film and a resist film (not shown) are formed on the first pattern portion 20A of the magnetic recording layer, followed by patterning the resist film by using photolithography technology to conform to the pattern of the lower electrode 17 shown in FIG. 42 and subsequently patterning the DLC film by using the patterned resist film. Then, the lower electrode 17, the magnetically fixed layer 18, the tunnel barrier wall layer 19 and the first pattern portion 20A of the magnetic recording layer are patterned by a RIE method or an ion milling method with the patterned resist film or the patterned DLC film used as a mask.

In the next step, the magnetically fixed layer 18, the tunnel barrier wall layer 19 and the first pattern portion 20A of the magnetic recording layer are patterned by a RIE method or an ion milling method with a resist film (not shown) or a DLC film (not shown), which is patterned to conform to the pattern of the TMR element 24 shown in FIG. 42, used as a mask.

Figure 47:
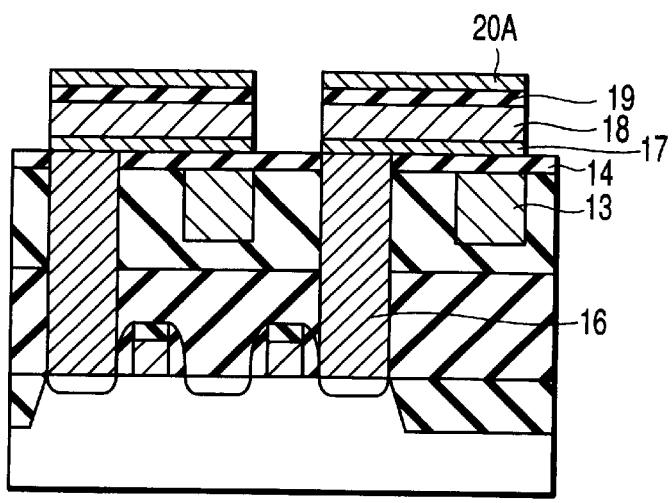
Figure 48:
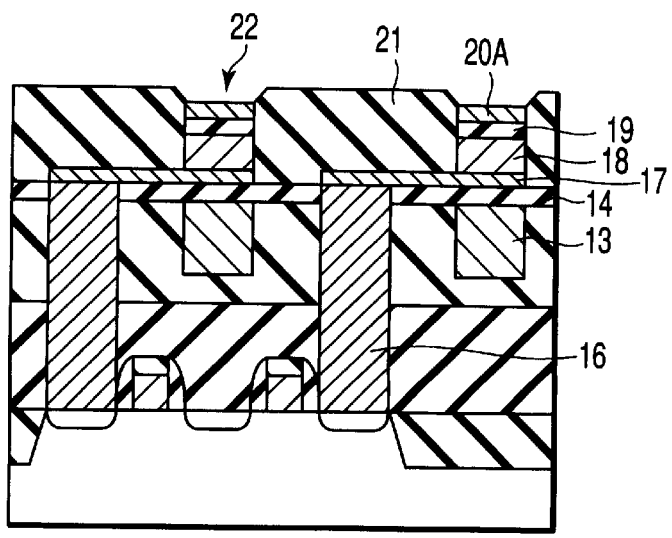

It should be noted that since the first pattern portion 20A of the magnetic recording layer, the tunnel barrier wall layer 19, the magnetically fixed layer 18 and the lower electrode 17 are patterned in the process shown in FIG. 47, a stepping is generated between the surface of the first pattern portion 20A of the magnetic recording layer and the surface of the third interlayer insulating film 14. In other words, in carrying out the process shown in FIG. 48, it is possible to pattern the tunnel barrier wall layer 19, the magnetically fixed layer 18 and the first pattern portion 20A of the magnetic recording layer in several steps because the underlying stepping is large. To be more specific, it is possible to coat the entire surface with, for example, an SOG film so as to flatted the entire surface, followed by collectively patterning the tunnel barrier wall layer 19, the magnetically fixed layer 18 and the first pattern portion 20A of the magnetic recording layer.

In the next step, a fourth interlayer insulating film 21 is deposited under the state that the mask, which was used for patterning the magnetically fixed layer 18, the tunnel barrier wall layer 19 and the first pattern portion 20A of the magnetic recording layer are left unremoved. Then, the fourth interlayer insulating film 21 is flatted by a CMP method with the remaining mask used as a stopper, thereby forming a via hole 22.

Finally, a metal material layer for a second patterned portion 20B of the magnetic recording layer and for a bit line 23 is deposited by, for example, a sputtering method on the fourth interlayer insulating film 21 and the first pattern portion 20A of the magnetic recording layer, as shown in FIG. 43. Then, the metal material layers for the second pattern portion 20B of the magnetic recording layer and for the bit line 23 are collectively patterned by photolithography technology using a resist film patterned to conform to the pattern of the bit line 23 shown in FIG. 42. As a result, the magnetic recording layer 20 and the bit line 23 are formed, thereby finishing the preparation of the TMR element 24. In this case, a constricted portion 71, which is narrower than the other portion, is formed in the pattern of a laminate structure consisting of the bit line 23 and the second pattern portion of the magnetic recording layer, such that the constricted portion 71 is positioned intermediate between the adjacent TMR elements 24.

According to the seventh embodiment of the present invention described above, the second pattern portion 20B of the second magnetic recording layer is allowed to extend along the bit line 23 so as to permit the magnetized region to extend to reach a region intermediate between the two adjacent cells. As a result, it is possible to realize the TMR element 24 that does not incur the influence of the signal deterioration caused by the generation of a magnetic pole without increasing the cell area.

It should be noted that the boundary layer 26 shown in FIG. 17 is movable in the direction of the bit line 23. If the boundary layer 26 is moved to reach a region right above the TMR element 24, it is possible for the cell information to be collapsed. Such being the situation, the constricted portion 71 is formed between the adjacent cells in the seventh embodiment of the present invention so as to permit the constricted portion 71 to trap the boundary layer 26. It follows that it is possible to prevent the boundary layer 26 being moved to a region right above the TMR element 24 so as to permit the generating region of the boundary layer 26 to be positioned between the adjacent cells. Under the circumstances, according to the seventh embodiment of the present invention, it is possible to suppress the increase in the influence of the diamagnetic field inside the cell so as to guarantee a more stable write and read operation.

It should be noted that it is possible to apply the technical idea of the seventh embodiment to all the semiconductor memory devices according to the first to sixth embodiments of the present invention described above.

[Eighth Embodiment]

In the eighth embodiment of the present invention, the constricted portion in the seventh embodiment is replaced by a folded portion.

Figure 49:
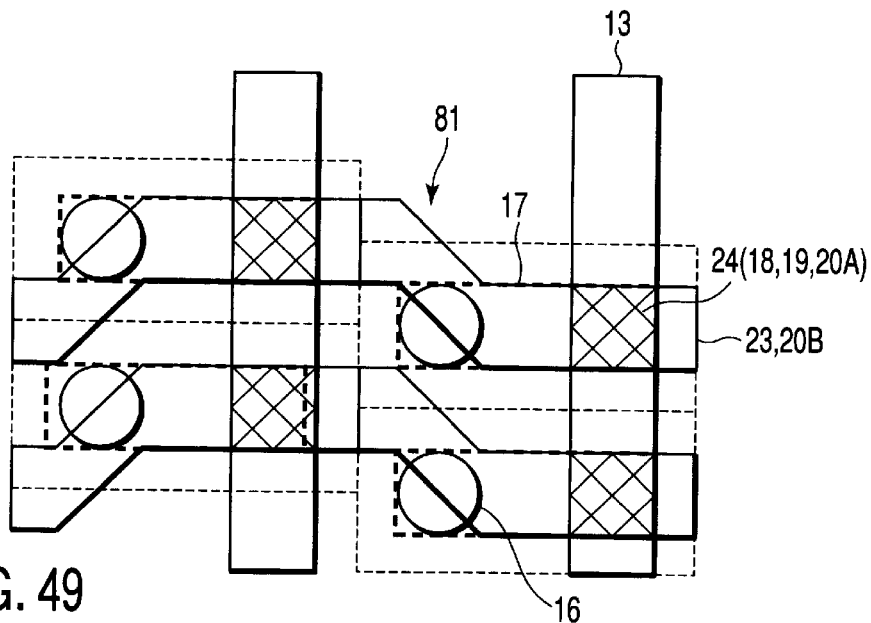
FIG. 49 is a plan view showing a semiconductor memory device according to an eighth embodiment of the present invention.

FIG. 49 is a plan view showing the construction of a semiconductor memory device according to the eighth embodiment of the present invention. As shown in FIG. 49, in the semiconductor memory device according to the eighth embodiment of the present invention, the magnetically fixed layer 18, the tunnel barrier wall layer 19 and the first pattern portion 20A of the magnetic recording layer included in the members constituting the TMR 24 are formed independently of the bit line 23 as in the semiconductor memory device according to the seventh embodiment of the present invention. However, the second pattern portion 20B of the magnetic recording layer is formed integral with the bit line 23 in the eighth embodiment. To be more specific, the second pattern portion 20B of the magnetic recording layer is formed to extend in the direction of the bit line 23 without being separated for each cell and extends along the bit 23. Further, a folded portion 81 is formed in the pattern of a laminate structure consisting of the bit line 23 and the second pattern portion 20B of the magnetic recording layer such that the folded portion 81 is positioned intermediate between the adjacent TMR elements 24.

It should be noted that the semiconductor memory device according to the eighth embodiment of the present invention can be manufactured by applying the manufacturing method of the semiconductor memory device according to the seventh embodiment of the present invention, except that the constricted portion 71 in the seventh embodiment is replaced by the folded portion 81. Therefore, the description of the manufacturing method of the semiconductor memory device according to the eighth embodiment is omitted.

According to the eighth embodiment of the present invention described above, the second pattern portion 20B of the second magnetic recording layer is allowed to extend along the bit line 23 so as to permit the magnetized region to extend to reach a region intermediate between the two adjacent cells. As a result, it is possible to realize the TMR element 24 that does not incur the influence of the signal deterioration caused by the generation of a magnetic pole without increasing the cell area.

It should also be noted that the folded portion 81 is formed between the adjacent cells in the eighth embodiment of the present invention so as to permit the folded portion 81 to trap the boundary layer 26. It follows that it is possible to prevent the boundary layer 26 to be moved to a region right above the TMR element 24 so as to permit the generating region of the boundary layer 26 to be positioned between the adjacent cells. Under the circumstances, according to the eighth embodiment of the present invention, it is possible to suppress the increase in the influence of the diamagnetic field inside the cell so as to guarantee a more stable write and read operation.

It should be noted that it is possible to apply the technical idea of the eighth embodiment to all the semiconductor memory devices according to the first to sixth embodiments of the present invention described above.

[Ninth Embodiment]

In the ninth embodiment of the present invention, the MOSFET included in the semiconductor memory device according to the seventh embodiment of the present invention is replaced by a diode.

Figure 50:
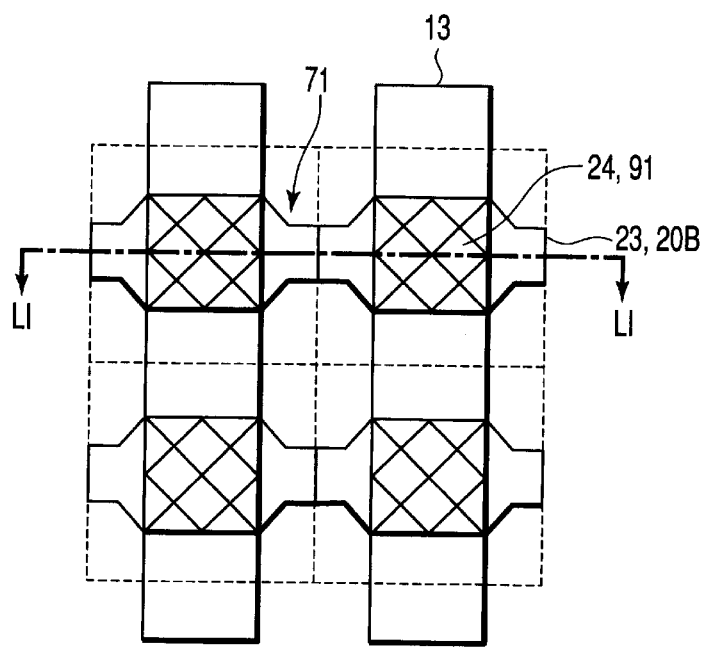
FIG. 50 is a plan view showing a semiconductor memory device according to a ninth embodiment of the present invention.

FIG. 50 is a plan view schematically showing the construction of a semiconductor memory device according to the ninth embodiment of the present invention. On the other hand, FIG. 51 is a cross sectional view showing the semiconductor memory device along the line LI—LI shown in FIG. 50.

Figure 51:
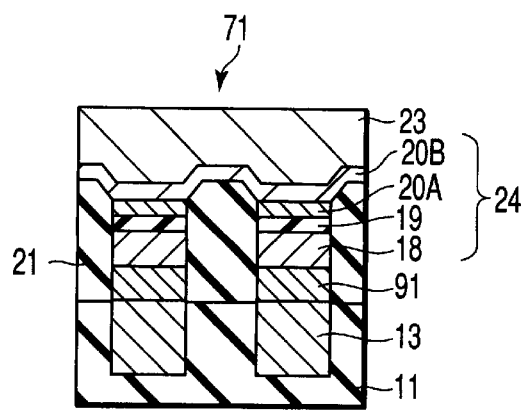
FIG. 51 is a cross sectional view showing a semiconductor memory device along the line LI—LI shown in FIG. 50.

As shown in FIGS. 50 and 51, the semiconductor memory device according to the ninth embodiment of the present invention is directed to an MRAM using as a memory element a TMR element 24 comprising a magnetically fixed layer 18, magnetic recording layers 20A, 20B, and a tunnel barrier wall layer 19 sandwiched between the magnetically fixed layer 18 and the magnetic recording layer 20A. Also, a pn junction diode 91 is arranged between the TMR element 24 and a write word line 13, and a bit line 23 connected to the magnetic recording layers 20A, 20B is arranged to cross the word line 13 at right angles.

Among the members constituting the TMR element 24, the magnetically fixed layer 18, the tunnel barrier wall layer 19 and the first pattern portion 20A of the magnetic recording layer are formed independent of the bit line 23. However, the second pattern portion 20B of the magnetic recording layer is formed integral with the bit line 23. To be more specific, the second pattern portion 20B of the magnetic recording layer is formed to extend in the direction of the bit line 23 without being separated for each cell and extends along the bit line 23. Further, a constricted portion 71, which is somewhat narrower than the other portion, is formed in the pattern formed of a laminate structure consisting of the bit line 23 and the second pattern portion 20B of the magnetic recording layer such that the constricted portion 71 is positioned intermediate between the two adjacent TMR elements 24.

FIGS. 52 to 55 are cross sectional views along the line LI—LI shown in FIG. 50 collectively showing the manufacturing process of the semiconductor memory device according to the ninth embodiment of the present invention. The manufacturing process of the semiconductor memory device according to the ninth embodiment of the present invention will now be described with reference to FIGS. 52 to 55.

Figure 52:
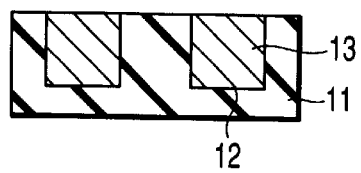
FIGS. 52, 53, 54 and 55 are cross sectional views collectively showing a method of manufacturing a semiconductor memory device according to the ninth embodiment of the present invention.

In the first step, a first interlayer insulating film 11 is formed as shown in FIG. 52. Then, a groove 12 for a word line is formed within the first interlayer insulating film 11 by a lithography method and a RIE method by using a pattern of the word line 13 shown in FIG. 50. Further, a metal material layer for forming a write word line 13 is deposited by a sputtering method, followed by flatting the deposited metal material layer by a CMP method until the surface of the first interlayer insulating film 11 is exposed to the outside, thereby forming the word line 13.

Figure 53:
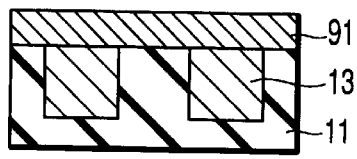

In the next step, an amorphous silicon layer of, for example, an n-type is deposited on the word line 13 and the first interlayer insulating film 11, followed by introducing, for example, boron (B) into an upper region of the amorphous silicon layer by means of an ion implantation so as to form a p-type diffusion layer (not shown) in an upper portion of the amorphous silicon layer, thereby forming a pn junction diode 91, as shown in FIG. 53.

Figure 54:
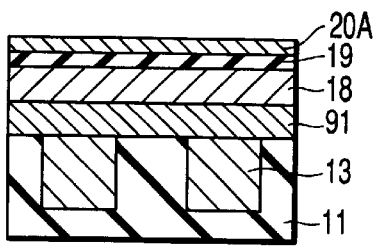

Then, a magnetically fixed layer 18, a tunnel barrier wall layer 19, and a first portion 20A of a magnetic recording layer are consecutively formed on the pn junction diode 91, as shown in FIG. 54. It should be noted that the magnetically fixed layer 18 is of a laminate structure formed of a plurality of films as shown in FIGS. 2A and 2B, though the magnetically fixed layer 18 is depicted as a single layer in FIG. 54.

Figure 55:
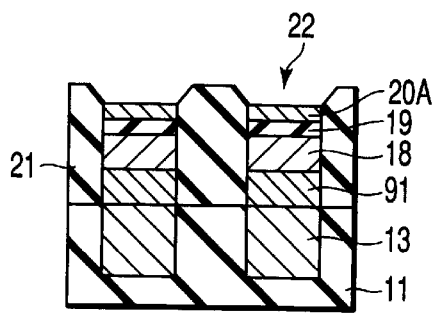

In the next step, the first pattern portion 20A of the magnetic recording layer, the tunnel barrier wall layer 19, the magnetically fixed layer 18 and the pn junction diode 91 are collectively patterned by a RIE method or an ion milling method, with a resist film (not shown) or a DLC film (not shown), which is patterned to conform to the pattern of the TMR element 24 shown in FIG. 50, used as a mask, as shown in FIG. 55. Then, a third interlayer insulating film 21 is deposited, with the mask, which was used for patterning the pn junction diode 91, the magnetically fixed layer 18, the tunnel barrier wall layer 19 and the first pattern portion 20A of the magnetic recording layer, left unremoved. Further, the third interlayer insulating film 21 is flatted by a CMP method with the remaining mask used as a stopper, followed by removing the mask. As a result, a via hole 22 for depositing a second pattern portion 20B of the magnetic recording layer and a bit line 23 is formed in an upper portion of the first pattern portion 20A of the magnetic recording layer.

Finally, metal material layers for forming the second pattern portion 20B of the magnetic recording layer and the bit line 23 are deposited within the via hole 22 and on the third interlayer insulating film 21 by, for example, a sputtering method, as shown in FIG. 51. Then, the metal material layers for forming the second pattern portion 20B of the magnetic recording layer and the bit line 23 are collectively patterned by the photolithography technology using a resist film patterned to conform to the pattern of the bit line 23 shown in FIG. 50, thereby finishing preparation of the TMR element 24. Incidentally, formed in this step is a constricted portion 71, which is somewhat narrower than the other portion, in the pattern of a laminate structure consisting of the bit line 23 and the second pattern portion 20B of the magnetic recording layer such that the constricted portion 71 is positioned intermediate between the two adjacent TMR elements 24.

The semiconductor memory device according to the ninth embodiment of the present invention permits producing effects similar to those produced by the semiconductor memory device according to the seventh embodiment of the present invention.

[Tenth Embodiment]

A folded portion is formed in the tenth embodiment in place of the constricted portion formed in the ninth embodiment.

Figure 56:
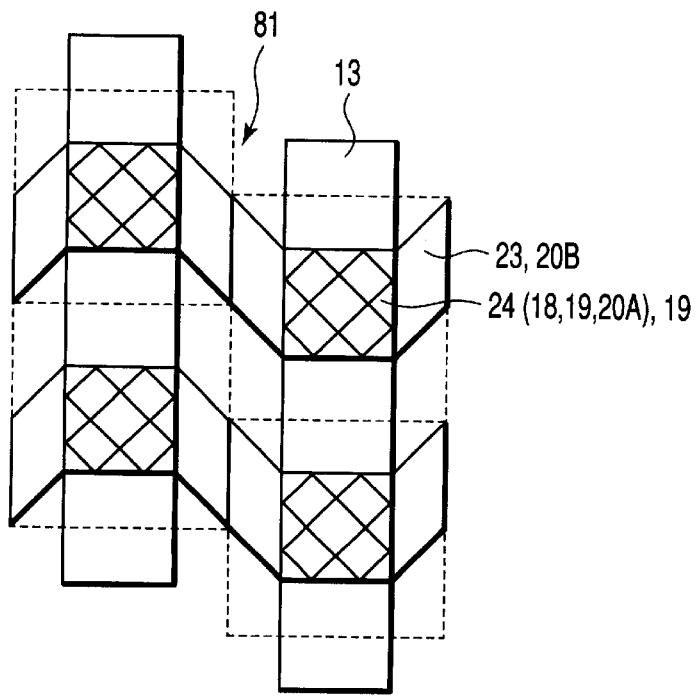
FIG. 56 is a plan view schematically showing the construction of a semiconductor memory device according to a tenth embodiment of the present invention.
Figure 57:
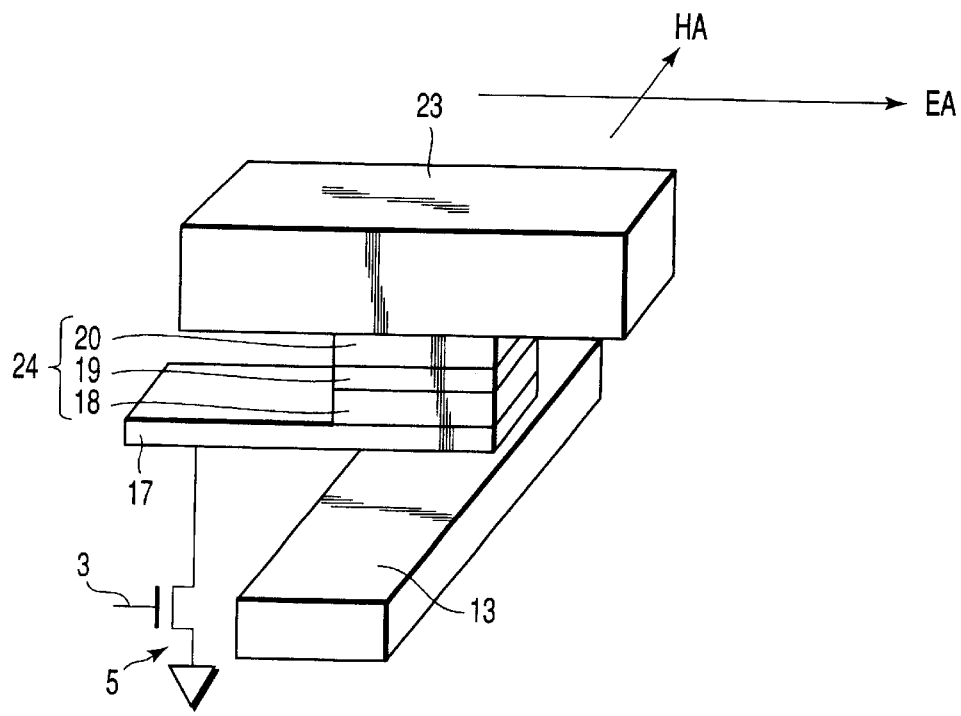
FIG. 57 is an oblique view showing a conventional semiconductor memory device.
Figure 58:
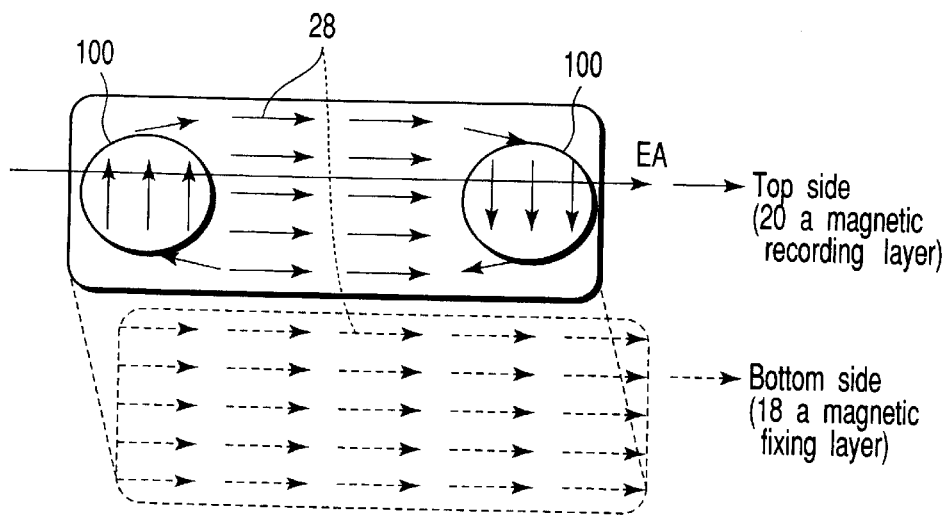
FIG. 58 is a drawing showing the directions of magnetization within a conventional semiconductor memory device.

FIG. 56 is a plan view showing a semiconductor memory device according to the tenth embodiment of the present invention. As shown in FIG. 56, in the semiconductor memory device according to the tenth embodiment of the present invention, the magnetically fixed layer 18, the tunnel barrier wall layer 19 and the first pattern portion 20A of the magnetic recording layer, which are included in the members constituting the TMR element 24, are formed independently of the bit line 23, as in the semiconductor memory device according to the ninth embodiment of the present invention. However, the second pattern portion 20B of the magnetic recording layer, which is also included in the TMR element 24, is formed integrally with the bit line 23. To be more specific, the second pattern portion 20B of the magnetic recording layer is formed to extend in the direction of the bit line 23 without being separated for each cell and extends along the bit 23. Further, a folded portion 81 is formed in the pattern of a laminate structure consisting of the bit line 23 and the second pattern portion 20B of the magnetic recording layer such that the folded portion 81 is positioned intermediate between the adjacent TMR elements 24.

It should be noted that the semiconductor memory device according to the tenth embodiment of the present invention can be manufactured by applying the manufacturing method of the semiconductor memory device according to the ninth embodiment of the present invention, except that the constricted portion 71 in the ninth embodiment is replaced by the folded portion 81. Therefore, the description of the manufacturing method of the semiconductor memory device according to the tenth embodiment is omitted.

The semiconductor memory device according to the tenth embodiment of the present invention produces effects similar to those produced by the semiconductor memory device according to the eighth embodiment of the present invention.

In each of the embodiments described above, a TMR element is used as the memory element. However, it is also possible to use in the present invention a GMR (giant magneto resistive) element comprising two magnetic layers and a conductive layer sandwiched between these two magnetic layers as the memory element.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device, comprising:

a first wiring extending in a first direction;

a second wiring extending in a second direction differing from said first direction; and a magneto resistive element arranged between said first wiring and said second wiring and comprising a first portion and a second portion, said second portion being in contact with said second wiring and extending along said second wiring to reach an outside region positioned outside said first portion.

2. The semiconductor memory device according to claim 1, wherein said second portion extends along said second wiring to reach at least an adjacent cell.

3. The semiconductor memory device according to claim 1, further comprising a constricted portion formed in the outside region, said constricted portion being formed in a portion where said second portion and said second wiring are narrower than said first portion.

4. The semiconductor memory device according to claim 1, further comprising a folded portion formed in the outside region, said folded portion being formed in a portion where said second portion and said second wiring are bent in a direction differing from said second direction.

5. The semiconductor memory device according to claim 1, further comprising a transistor or a diode connected to said magneto resistive element.

6. The semiconductor memory device according to claim 5, wherein said diode is arranged between said magneto resistive element and said first wiring and is connected to said magneto resistive element and said first wiring.

7. The semiconductor memory device according to claim 1, wherein said magneto resistive element comprises:

a first magnetic layer;

a second magnetic layer; and a first nonmagnetic layer interposed between said first magnetic layer and said second magnetic layer.

8. The semiconductor memory device according to claim 7, wherein said first portion comprises one of said first and second magnetic layers and said first nonmagnetic layer, and said second portion comprises the other of said first and second magnetic layers.

9. The semiconductor memory device according to claim 8, wherein a part of the other of said first and second magnetic layers is included in said first portion.

10. The semiconductor memory device according to claim 8, wherein said second portion is said second magnetic layer, and said second magnetic layer is a magnetic recording layer.

11. The semiconductor memory device according to claim 8, wherein said second portion is said first magnetic layer and said first magnetic layer is a magnetically fixed layer.

12. The semiconductor memory device according to claim 7, wherein said first portion is said first magnetic layer, and said second portion includes said first nonmagnetic layer and said second magnetic layer.

13. The semiconductor memory device according to claim 1, wherein said magneto resistive element comprises:

a first magnetic layer;

a second magnetic layer;

a third magnetic layer;

a first nonmagnetic layer sandwiched between said first and second magnetic layers; and a second nonmagnetic layer sandwiched between said second and third magnetic layers.

14. The semiconductor memory device according to claim 13, wherein said first portion includes one of said first and third magnetic layers and said first and second nonmagnetic layers, and said second portion includes the other of said first and third magnetic layers.

15. The semiconductor memory device according to claim 14, wherein a part of the other of said first and third magnetic layers is included in said first portion.

16. The semiconductor memory device according to claim 14, wherein said first and third magnetic layers are magnetically fixed layers.

* * * * *